United States Patent
Kim et al.

(10) Patent No.: US 10,373,564 B2
(45) Date of Patent: Aug. 6, 2019

(54) SCAN DRIVER AND RELATED DISPLAY APPARATUS

(71) Applicant: Samsung Display Co., LTD., Yongin-si, Gyeonggi-Do (KR)

(72) Inventors: Ji-Hye Kim, Seoul (KR); Min-Kyu Woo, Gwangmyeong-si (KR)

(73) Assignee: Samsung Display Co., Ltd. (KR)

( * ) Notice: Subject to any disclaimer, the term of this patent is extended or adjusted under 35 U.S.C. 154(b) by 21 days.

(21) Appl. No.: 15/458,668

(22) Filed: Mar. 14, 2017

(65) Prior Publication Data

US 2017/0287404 A1  Oct. 5, 2017

(30) Foreign Application Priority Data

Mar. 31, 2016 (KR) .................. 10-2016-0039277

(51) Int. Cl.
  *G09G 3/3266*  (2016.01)
  *G09G 3/3291*  (2016.01)

(52) U.S. Cl.
  CPC ......... *G09G 3/3266* (2013.01); *G09G 3/3291* (2013.01); *G09G 2300/0426* (2013.01); *G09G 2300/0871* (2013.01); *G09G 2310/0278* (2013.01); *G09G 2310/0291* (2013.01)

(58) Field of Classification Search
  CPC ..... G09G 3/3266; G09G 3/3275–3291; G09G 3/3674; G09G 3/3677; G09G 3/3685; G09G 3/3688; G09G 2310/02–0213; G09G 2310/0278; G09G 2310/0286–0294; G09G 2310/06; G09G 2310/08; G09G 2300/0426; G09G 2300/0838; G09G 2300/0871; G09G 2320/0219; G09G 2320/0223; G11C 19/00; G11C 19/18; G11C 19/28; G11C 19/38; G11C 19/184; G11C 19/287; G11C 27/04

See application file for complete search history.

(56) References Cited

U.S. PATENT DOCUMENTS

| 9,646,541 | B2 * | 5/2017 | Kim ..................... G09G 3/3266 |
| 2008/0218502 | A1 * | 9/2008 | Lee ..................... G09G 3/3674 345/208 |
| 2009/0021662 | A1 * | 1/2009 | Chang .................. G02F 1/1368 349/46 |
| 2010/0141570 | A1 * | 6/2010 | Horiuchi .............. G09G 3/3611 345/100 |
| 2010/0156869 | A1 * | 6/2010 | Lee ..................... G09G 3/3677 345/208 |

(Continued)

FOREIGN PATENT DOCUMENTS

KR  10-2014-0038148 A  3/2014

*Primary Examiner* — Roberto W Flores
(74) *Attorney, Agent, or Firm* — Innovation Counsel LLP

(57) ABSTRACT

A scan driver may include a first stage, a second stage, and a third stage. The first stage may include a first output transistor. The first output transistor may have a first buffer value. The second stage may be electrically connected to the first output transistor and may include a second output transistor. The second output transistor may have a second buffer value. The third stage may be electrically connected to the second output transistor and may include a third output transistor. The third output transistor may have a third buffer value. At least one of the second buffer value and the third buffer value may be unequal to the first buffer value.

19 Claims, 25 Drawing Sheets

(56) References Cited

U.S. PATENT DOCUMENTS

| | | | | |
|---|---|---|---|---|
| 2011/0157263 A1* | 6/2011 | Kim | ................. | G09G 3/3677 345/698 |
| 2012/0249604 A1* | 10/2012 | Kim | ................. | G09G 3/3258 345/690 |
| 2014/0078029 A1* | 3/2014 | Jang | ................. | G09G 3/32 345/82 |
| 2016/0300532 A1* | 10/2016 | Tan | ................. | G09G 3/3258 |

* cited by examiner

SCAN DRIVER AND RELATED DISPLAY APPARATUS

CROSS-REFERENCE TO RELATED APPLICATION(S)

This application claims priority under 35 U.S.C. § 119 to Korean Patent Application No. 10-2016-0039277, filed on Mar. 31, 2016 in the Korean Intellectual Property Office; the contents of the Korean Patent Application are incorporated herein by reference.

BACKGROUND

1. Field

The technical field is related to a scan driver and a display apparatus including the scan driver.

2. Description of the Related Art

Flat panel display apparatuses may include liquid crystal display (LCD) apparatuses, field emission display (FED) apparatuses, plasma display panel (PDP) apparatuses, organic light-emitting diode (OLED) display apparatuses, etc.

As an example, an OLED display apparatus may include a display panel that includes a plurality of pixels arranged in a matrix and includes driving circuits for transmitting image data signals and scan signals to the pixels to display an image. The driving circuits may include a data driver for transmitting the image data signals through data lines connected to the pixels and may include a scan driver for transmitting the scan signals through scan lines connected to the pixels.

SUMMARY

Embodiments may be related to a scan driver for optimizing image display quality of a display panel.

Embodiments may be related to a display apparatus including the scan driver.

In an embodiment, a scan driver includes a plurality of stages. The plurality of stages is connected to a plurality of pixels through a plurality of scan lines. The stages are sequentially disposed. Each of the stages includes a signal output part configured to output a scan writing signal to a scan line. A buffer size of (or buffer value) the signal output part of an x-th stage of the stages is unequal to a buffer size (or buffer value) of the signal output part of a y-th stage of the stages, wherein x is a natural number, and y is another natural number. The term "buffer size" may mean "buffer value".

In an embodiment, each of the stages may be configured to output at least two scan writing pulses to a corresponding scan line during a frame period that has a length of a frame.

In an embodiment, each of the stages is configured to output three scan writing pulses to a corresponding scan line during a frame period, an n-th stage is a last stage of the stages, a buffer size of a first output transistor of the signal output part of the n-th stage may be less than a buffer size of a first output transistor of the signal output part of an (n−2)-th stage, and the buffer size of the first output transistor of the signal output part of the (n−2)-th stage may be less than a buffer size of a first output transistor of the signal output part of an (n−4)-th stage.

In an embodiment, each of the stages is configured to output three scan writing pulses to a corresponding scan line during a frame period, the n-th stage is the last stage of the stages the buffer size of the first output transistor of the signal output part of the n-th stage may be substantially the same as a buffer size of a first output transistor of the signal output part of an (n−1)-th stage, and the buffer size of the first output transistor of the signal output part of the (n−2)-th stage may be substantially the same as a buffer size of a first output transistor of the signal output part of an (n−3)-th stage.

In an embodiment, each of the stages is configured to output four scan writing pulses to a corresponding scan line during a frame period, an n-th stage is a last stage of the stages, a buffer size of a first output transistor of the signal output part of the n-th stage may be less than a buffer size of a first output transistor of the signal output part of an (n−2)-th stage, the buffer size of the first output transistor of the signal output part of the (n−2)-th stage may be less than a buffer size of a first output transistor of the signal output part of an (n−4)-th stage, and the buffer size of the first output transistor of the signal output part of the (n−4)-th stage may be less than a buffer size of a first output transistor of the signal output part of an (n−6)-th stage; n is a natural number.

In an embodiment, each of the stages is configured to output four scan writing pulses to a corresponding scan line during a frame period, the n-th stage is the last stage of the stages, the buffer size of the first output transistor of the signal output part of the n-th stage may be substantially the same as a buffer size of a first output transistor of the signal output part of an (n−1)-th stage, the buffer size of the first output transistor of the signal output part of the (n−2)-th stage may be substantially equal to a buffer size of a first output transistor of the signal output part of an (n−3)-th stage, and the buffer size of the first output transistor of the signal output part of the (n−4)-th stage may be substantially equal to a buffer size of a first output transistor of the signal output part of an (n−5)-th stage.

In an embodiment, each of the stages is configured to output two scan writing pulses to a corresponding scan line during a frame period, an n-th stage is a last stage of the stages, and a buffer size of a first output transistor of the signal output part of the n-th stage may be less than a buffer size of a first output transistor of the signal output part of an (n−2)-th stage; n is a natural number.

In an embodiment, each of the stages is configured to output two scan writing pulses to a corresponding scan line during a frame period, the n-th stage is the last stage of the stages, and the buffer size of the first output transistor of the signal output part of the n-th stage may be substantially equal to a buffer size of a first output transistor of the signal output part of an (n−1)-th stage.

In an embodiment, each of the stages further may further include the following elements: a pulse detecting part configured to detect a pulse of an input signal to activate a pull down control node in response to a first clock signal, a pull down control part configured to initialize the pull down control node in response to a second clock signal, and a pull up control part configured to adjust a signal of a pull up control node in response to the first clock signal and a signal of the pull down control node. The signal output part may be configured to output the scan writing signal in response to the signal of the pull down control node and the signal of the pull up control node.

In an embodiment, the signal output part may include a pull down part configured to generate a scan writing pulse of the scan writing signal in response to the signal of the pull down control node and may include a pull up part configured to maintain a high level of the scan writing signal in response to the signal of the pull up control node.

In an embodiment, a buffer size of a transistor of the pull down part of the x-th stage may be unequal to a buffer size of a transistor of the pull down part of the y-th stage.

In an embodiment, a buffer size of a transistor of the pull down part of the x-th stage may be unequal to a buffer size of a transistor of the pull down part of the y-th stage. A buffer size of a transistor of the pull up part of the x-th stage may be unequal to a buffer size of a transistor of the pull up part of the y-th stage.

In an embodiment, the pulse detecting part may include a first transistor, the first transistor comprising a gate electrode to which the first clock signal is applied, a source electrode to which the input signal is applied and a drain electrode connected to a first node. The pull down control part may include a second transistor and a third transistor, the second transistor comprising a gate electrode connected to the pull up control node, a source electrode to which a first power voltage is applied and a drain electrode connected to a source electrode of the third transistor, the third transistor comprising a gate electrode to which the second clock signal is applied, the source electrode connected to the drain electrode of the second transistor and a drain electrode connected to the first node. The pull up control part may include a fourth transistor and a fifth transistor, the fourth transistor comprising a gate electrode connected to the first node, a source electrode connected to the gate electrode of the second transistor and a drain electrode connected to a second node, the fifth transistor comprising a gate electrode connected to the second node, a source electrode connected to the gate electrode of the second transistor and a drain electrode to which a second power voltage is applied. The pull down part may include the first output transistor, the first output transistor comprising a gate electrode connected to the pull down control node, a source electrode connected to an output node and a drain electrode to which the second clock signal is applied. The pull up part may include a second output transistor, the second output transistor comprising a gate electrode connected to the gate electrode of the second transistor, a source electrode to which the first power voltage is applied and a drain electrode connected to the output node.

In an embodiment, each of the stages may include a scan writing stage configured to output the scan writing signal, a scan initialization stage configured to output a scan initialization signal and a scan bypass stage configured to output a scan bypass signal.

In an embodiment, the buffer size of the first output transistor may be a width-to-length ratio of (a channel/gate of) the first output transistor.

In an embodiment, a display apparatus display apparatus includes a display panel, a scan driver and a data driver. The display panel includes a plurality of scan lines, a plurality of data lines and a plurality of pixels connected to the plurality of scan lines and the plurality of data lines. The scan driver includes a plurality of stages, the plurality of stages being connected to the plurality of pixels through the plurality of scan lines, the stages being sequentially disposed. The data driver is configured to provide data voltages to the plurality of data lines. Each of the stages includes a signal output part configured to output a scan writing signal to the scan line. A buffer size of the signal output part of an x-th stage of the stages is unequal to a buffer size of the signal output part of a y-th stage of the stages, wherein x is a natural number, and y is another natural number.

In an embodiment, each of the stages may be configured to output at least two scan writing pulses to a corresponding scan line during a frame period that has a length of a frame.

In an embodiment, each of the stages further may further include the following elements: a pulse detecting part configured to detect a pulse of an input signal to activate a pull down control node in response to a first clock signal, a pull down control part configured to initialize the pull down control node in response to a second clock signal, a pull up control part configured to adjust a signal of a pull up control node in response to the first clock signal and a signal of the pull down control node. The signal output part may be configured to output the scan writing signal in response to the signal of the pull down control node and the signal of the pull up control node.

In an embodiment, the signal output part may include a pull down part configured to generate a scan writing pulse of the scan writing signal in response to the signal of the pull down control node and may include a pull up part configured to maintain a high level of the scan writing signal in response to the signal of the pull up control node.

In an embodiment, a buffer size of a transistor of the pull down part of the x-th stage may be unequal to a buffer size of a transistor of the pull down part of the y-th stage.

An embodiment may be related to a scan driver. The scan driver may include a first stage, a second stage, and a third stage. The first stage may include a first output part. The first output part may include a first output transistor and may provide a first signal. The first output transistor may have a first buffer value. The second stage may be electrically connected to the first output transistor, may receive a copy of the first signal, and may include a second output part. The second output part may include a second output transistor and may provide a second signal. The second output transistor may have a second buffer value. The third stage may be electrically connected to the second output transistor, may receive a copy of the second signal, and may include a third output part. The third output part may include a third output transistor and may provide a third signal. The third output transistor may have a third buffer value. At least one of the second buffer value and the third buffer value may be unequal to the first buffer value.

The first buffer value may be equal to a ratio of a width of a channel of the first output transistor to a length of the channel of the first output transistor. The second buffer value may be equal to a ratio of a width of a channel of the second output transistor to a length of the channel of the second output transistor. The third buffer value may be equal to a ratio of a width of a channel of the third output transistor to a length of the channel of the third output transistor.

A source electrode of an input transistor of the second stage may be electrically connected through no transistor to a drain electrode of the first output transistor. The second buffer value may be less than the first buffer value.

A source electrode of an input transistor of the third stage may be electrically connected through no transistor to a drain electrode of the second output transistor. The third buffer value may be less than the first buffer value.

The scan driver may include a fourth stage. The fourth stage may include a fourth output part. The fourth output part may include a fourth output transistor and may provide a fourth signal. The fourth output transistor may have a fourth buffer value. The first stage may be electrically connected to the fourth output transistor and may receive a copy of the fourth signal. The third buffer value may be less than the fourth buffer value.

The scan driver may include a first power voltage input unit and a second power voltage input unit. The first power voltage input unit may receive a first power voltage. The second power voltage input unit may be electrically insulated from the first power voltage input unit and receive a second power voltage. The second power voltage may be lower than the first power voltage. The first stage may include a first stabilizing transistor. A gate electrode of the first stabilizing transistor may be electrically connected through no transistor to the second power voltage input unit. A drain electrode of the first stabilizing transistor may be electrically connected through no transistor to a gate electrode of the first output transistor. The second stage may include a second stabilizing transistor. A gate electrode of the second stabilizing transistor may be electrically connected through no transistor to the second power voltage input unit. A drain electrode of the second stabilizing transistor may be electrically connected through no transistor to a gate electrode of the second output transistor. The third stage may include a third stabilizing transistor. A gate electrode of the third stabilizing transistor may be electrically connected through no transistor to the second power voltage input unit. A drain electrode of the third stabilizing transistor may be electrically connected through no transistor to a gate electrode of the third output transistor.

The first stage (and/or the first output part) may include a first pull-up transistor. A source electrode of the first pull-up transistor may be electrically connected through no transistor to the first power voltage unit. A drain electrode of the first pull-up transistor may be electrically connected through no transistor to a drain electrode of the first output transistor. The second stage (and/or the second output part) may include a second pull-up transistor. A source electrode of the second pull-up transistor may be electrically connected through no transistor to the first power voltage unit. A drain electrode of the second pull-up transistor may be electrically connected through no transistor to a drain electrode of the second output transistor. The third stage (and/or the third output part) may include a third pull-up transistor. A source electrode of the third pull-up transistor may be electrically connected through no transistor to the first power voltage unit. A drain electrode of the third pull-up transistor may be electrically connected through no transistor to a drain electrode of the third output transistor. A buffer value of the third pull-up transistor may be less than a buffer value of the first pull-up transistor. A buffer value of the second pull-up transistor may be less than a buffer value of the first pull-up transistor.

The scan driver may include a first power voltage input unit and a second power voltage input unit. The first power voltage input unit may receive a first power voltage. The second power voltage input unit may be electrically insulated from the first power voltage input unit and receive a second power voltage. The second power voltage may be lower than the first power voltage. A source electrode of the first output transistor may be electrically connected through no transistor to the first power voltage input unit. A source electrode of the second output transistor may be electrically connected through no transistor to the first power voltage input unit. A source electrode of the third output transistor may be electrically connected through no transistor to the first power voltage input unit.

The first output part may include a first cooperating transistor. A drain electrode of the first cooperating transistor may be electrically connected through no transistor to a drain electrode of the first output transistor. The second output part may include a second cooperating transistor. A drain electrode of the second cooperating transistor may be electrically connected through no transistor to a drain electrode of the second output transistor. The third output part may include a third cooperating transistor. A drain electrode of the third cooperating transistor may be electrically connected through no transistor to a drain electrode of the third output transistor. A buffer value of the third cooperating transistor may be less than a buffer value of the first cooperating transistor. A buffer value of the second cooperating transistor may be less than a buffer value of the first cooperating transistor.

The buffer value of the first cooperating transistor may be equal to a ratio of a width of a channel of the first cooperating transistor to a length of the channel of the first cooperating transistor. The buffer value of the second cooperating transistor may be equal to a ratio of a width of a channel of the second cooperating transistor to a length of the channel of the second cooperating transistor. The buffer value of the third cooperating transistor may be equal to a ratio of a width of a channel of the third cooperating transistor to a length of the channel of the third cooperating transistor.

The scan driver may include a fourth stage and a fifth stage. The fourth stage may be electrically connected to the third output transistor, may receive a copy of the third signal, and may include a fourth output part. The fourth output part may include a fourth output transistor and may provide a fourth signal. The fourth output transistor may have a fourth buffer value. The fifth stage may be electrically connected to the fourth output transistor, may receive a copy of the fourth signal, and may include a fifth output part. The fifth output part may include a fifth output transistor and may provide a fifth signal. The fifth output transistor may have a fifth buffer value. The fifth buffer value may be unequal to the third buffer value and may be unequal to the first buffer value.

The fifth buffer value may be less than the third buffer value. The third buffer value may be less than the first buffer value.

The fourth buffer value may be less than the second buffer value. The second buffer value may be less than the first buffer value.

The scan driver may include a sixth stage and a seventh stage. The sixth stage may include a sixth output part. The sixth output part may include a sixth output transistor and may provide a sixth signal. The sixth output transistor may have a sixth buffer value. The first stage may be electrically connected to the sixth output transistor and may be may receive a copy of the sixth signal. The third buffer value may be less than the sixth buffer value. The second buffer value may be less than the sixth buffer value.

The scan driver may include a sixth stage and a seventh stage. The sixth stage may be electrically connected to the third output transistor, may receive a copy of the third signal, and may include a sixth output part. The sixth output part may include a sixth output transistor and may provide a sixth signal. The sixth output transistor may have a sixth buffer value. The seventh stage may be electrically connected to the sixth output transistor, may receive a copy of the sixth signal, and may include a seventh output part. The seventh output part may include a seventh output transistor and may provide a seventh signal. The seventh output transistor may have a seventh buffer value. The seventh buffer value may be unequal to the fifth buffer value, may be unequal to the third buffer value, and may be unequal to the first buffer value.

The seventh buffer value may be less than the fifth buffer value. The fifth buffer value may be less than the third buffer value. The third buffer value may be less than the first buffer value.

The first output part may be may sequentially provide a first first-signal pulse, a second first-signal pulse, a third first-signal pulse, and a fourth first-signal pulse in a predetermined frame length. The second output part may be may sequentially provide a first second-signal pulse, a second second-signal pulse, a third second-signal pulse, and a fourth second-signal pulse in the predetermined frame length. The third output part may be may sequentially provide a first third-signal pulse, a second third-signal pulse, a third third-signal pulse, and a fourth third-signal pulse in the predetermined frame length. The fourth output part may be may sequentially provide a first fourth-signal pulse, a second fourth-signal pulse, a third fourth-signal pulse, and a fourth fourth-signal pulse in the predetermined frame length. The fifth output part may be may sequentially provide a first fifth-signal pulse, a second fifth-signal pulse, a third fifth-signal pulse, and a fourth fifth-signal pulse in the predetermined frame length. The sixth output part may be may sequentially provide a first sixth-signal pulse, a second sixth-signal pulse, a third sixth-signal pulse, and a fourth sixth-signal pulse in the predetermined frame length. The seventh output part may be may sequentially provide a first seventh-signal pulse, a second seventh-signal pulse, a third seventh-signal pulse, and a fourth seventh-signal pulse in the predetermined frame length. A start edge of the fourth first-signal pulse may coincide with a start edge of the first seventh-signal pulse. An end edge of the fourth first-signal pulse may coincide with an end edge of the first seventh-signal pulse.

The first signal may include a first first-signal pulse, a second first-signal pulse, a third first-signal pulse, and a fourth first-signal pulse that are sequentially provided within a first frame period. The seventh signal may include a first seventh-signal pulse, a second seventh-signal pulse, a third seventh-signal pulse, and a fourth seventh-signal pulse that are sequentially provided in a second frame period. A length of the first frame period may be equal to a length of the second frame period. A start edge of the fourth first-signal pulse may coincide with a start edge of the first seventh-signal pulse. An end edge of the fourth first-signal pulse may coincide with an end edge of the first seventh-signal pulse.

The first output part may be may sequentially provide a first first-signal pulse, a second first-signal pulse, and a third first-signal pulse in a predetermined frame length. The second output part may be may sequentially provide a first second-signal pulse, a second second-signal pulse, and a third second-signal pulse in the predetermined frame length. The third output part may be may sequentially provide a first third-signal pulse, a second third-signal pulse, and a third third-signal pulse in the predetermined frame length. The fourth output part may be may sequentially provide a first fourth-signal pulse, a second fourth-signal pulse, and a third fourth-signal pulse in the predetermined frame length. The fifth output part may be may sequentially provide a first fifth-signal pulse, a second fifth-signal pulse, and a third fifth-signal pulse in the predetermined frame length. A start edge of the third first-signal pulse may coincide with a start edge of the first fifth-signal pulse. An end edge of the third first-signal pulse may coincide with an end edge of the first fifth-signal pulse.

The first signal may include a first first-signal pulse, a second first-signal pulse, and a third first-signal pulse that are sequentially provided within a first frame period. The fifth signal may include a first fifth-signal pulse, a second fifth-signal pulse, and a third fifth-signal pulse that are sequentially provided within a second frame period. A length of the first frame period may be equal to a length of the second frame period. A start edge of the third first-signal pulse may coincide with a start edge of the first fifth-signal pulse. An end edge of the third first-signal pulse may coincide with an end edge of the first fifth-signal pulse.

The first output part may be may sequentially provide a first first-signal pulse and a second first-signal pulse in a predetermined frame length. The second output part may be may sequentially provide a first second-signal pulse and a second second-signal pulse in the predetermined frame length. The third output part may be may sequentially provide a first third-signal pulse and a second third-signal pulse in the predetermined frame length. A start edge of the second first-signal pulse may coincide with a start edge of the first third-signal pulse. An end edge of the second first-signal pulse may coincide with an end edge of the first third-signal pulse.

The first output part may be may provide a third first-signal pulse subsequent to the second first-signal pulse in the predetermined frame length. The second output part may be may provide a third second-signal pulse subsequent to the second second-signal pulse in the predetermined frame length. The third output part may be may provide a third third-signal pulse subsequent to the second third-signal pulse in the predetermined frame length. A start edge of the third first-signal pulse may coincide with a start edge of the second third-signal pulse. An end edge of the third first-signal pulse may coincide with an end edge of the second third-signal pulse.

The first signal may include a first first-signal pulse and a second first-signal pulse that are sequentially provided within a first frame period. The third signal may include a first third-signal pulse and a second third-signal pulse that are sequentially provided within a second frame period. A length of the first frame period may be equal to a length of the second frame period. A start edge of the second first-signal pulse may coincide with a start edge of the first third-signal pulse. An end edge of the second first-signal pulse may coincide with an end edge of the first third-signal pulse.

The first signal may include a third first-signal pulse subsequent to the second first-signal pulse within the first frame period. The third signal may include a third third-signal pulse subsequent to the second third-signal pulse within the second frame period. A start edge of the third first-signal pulse may coincide with a start edge of the second third-signal pulse. An end edge of the third first-signal pulse may coincide with an end edge of the second third-signal pulse.

An embodiment may be related to a display apparatus. The display apparatus may include a first stage, a first pixel, a second stage, a second pixel, a third stage, and a third pixel. The first stage may include a first output part. The first output part may include a first output transistor and may provide a first signal. The first output transistor may have a first buffer value. The first pixel electrically may be connected to the first output transistor and may receive a first copy of the first signal. The second stage may be electrically connected to the first output transistor, may receive a second copy of the first signal, and may include a second output part. The second output part may include a second output transistor and may provide a second signal. The second output transistor may have a second buffer value. The second pixel may be electrically connected to the second output transistor and may receive a first copy of the second signal. The third stage electrically connected to the second output transistor, may receive a second copy of the second signal, and may include a third output part. The third output part may include a third output transistor and may provide a third signal. The third output transistor may have a third buffer value. At least one of the second buffer value and the third buffer value may be unequal to the first buffer value. The third pixel may be electrically connected to the third output transistor and may receive a first copy of the third signal.

According to embodiments, at least two scan pulses are outputted to a scan line in a frame so that a display panel may display a desired luminance when the display panel displays a white image after a black image.

According to embodiments, buffer sizes (or buffer values) of output transistors of a scan driver corresponding to an end portion of a display panel may be properly configured (and may be different) to prevent image defects, such as a relatively dark image portion at the end portion of the display panel, when at least two scan pulses are outputted to a scan line in a frame. Thus, satisfactory image display quality of the display panel may be attained.

DETAILED DESCRIPTION OF EMBODIMENTS

Embodiments explained in detail with reference to the accompanying drawings.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The term "connect" may mean "electrically connect". The term "insulate" may mean "electrically insulate". The term "electrically connected" may mean "electrically connected without any intervening transistors" or "electrically connected through no transistor".

The term "buffer size" may mean "buffer value".

Figure 1:
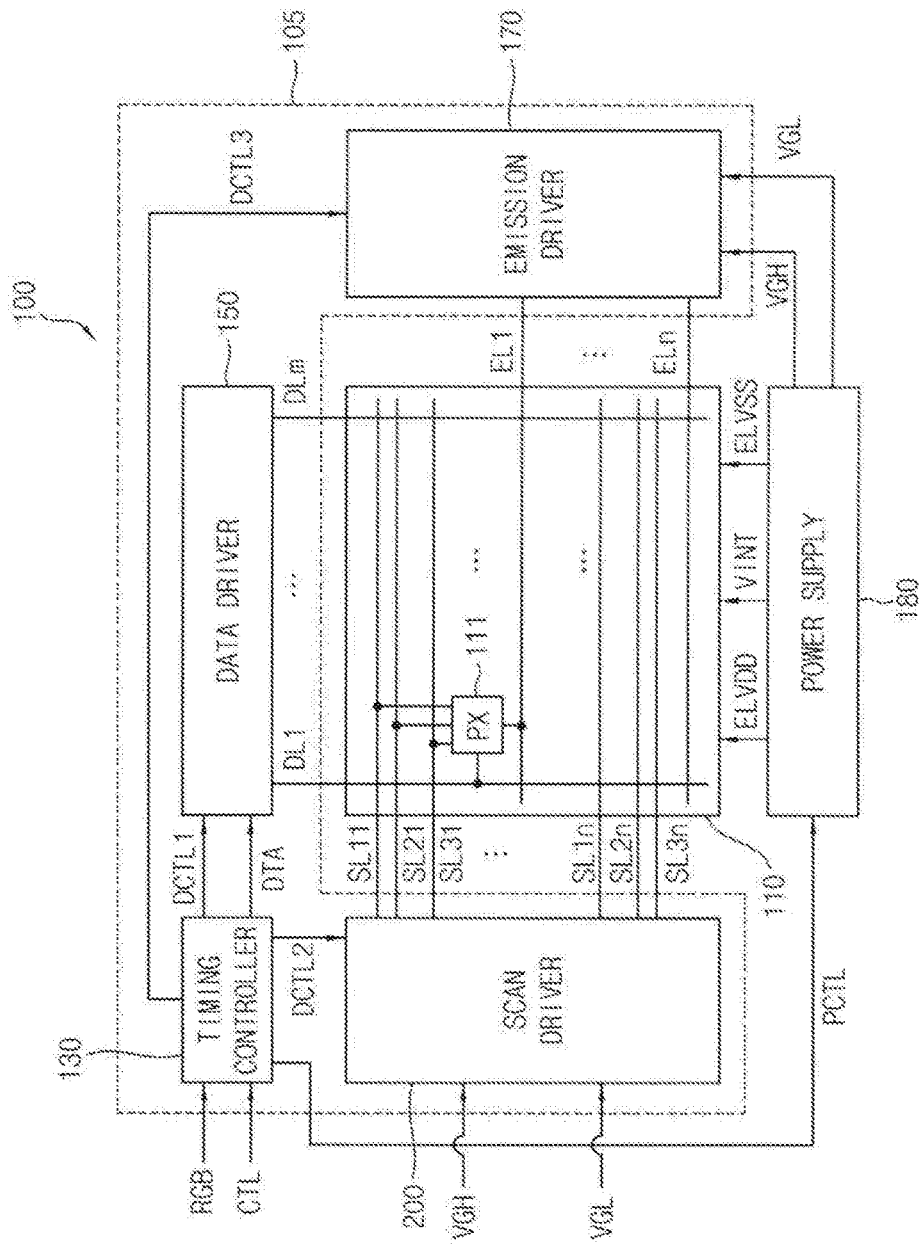
FIG. 1 is a block diagram illustrating a display apparatus according to an embodiment.

FIG. 1 is a block diagram illustrating a display apparatus according to an embodiment.

Referring to FIG. 1, the display apparatus 100 may include a driving circuit 105, a display panel 110 and a power supply 180. For example, the display apparatus 100 may be an organic light emitting diode (OLED) display apparatus.

The driving circuit 105 may include a timing controller 130, a data driver 150, a scan driver 200, and an emission driver 170. In an embodiment, the OLED display apparatus 100 may further include a mode signal generator 190. The timing controller 130, the data driver 150, the scan driver 160, and the emission driver 170 may be connected to the display panel 110 by a chip-on flexible printed circuit (COF), a chip-on glass (COG), a flexible printed circuit (FPC), etc.

The display panel 110 may be connected to the scan driver 200 of the driving circuit 105 through a first group of scan lines SL11 to SL1n (n is an integer greater than three), a second group of scan lines SL21 to SL2n, and a third group of scan lines SL31 to SL3n. The display panel 110 may be connected to the data driver 150 through a plurality of data lines DL1 to DLm (m is an integer greater than three). The display panel 110 may be connected to the emission driver 170 of the driving circuit 220 through a plurality of emission control lines EL1 to ELn. The display panel 110 may include a plurality of pixels 111, and each pixel 111 is disposed at an intersection of each of first group of scan lines SL11 to SL1n, each of the second group of scan lines SL21 to SL2n, each of the third group of scan lines SL31 to SL3n, each of the data lines DL1 to DLm and each of the emission control lines EL1 to ELn. The first group of scan lines SL11 to SL1n, the second group of scan lines SL21 to SL2n and the third group of scan lines SL31 to SL3n may be referred to as a plurality of scan lines.

The power supply 180 may provide a high power supply voltage ELVDD, a low power supply voltage ELVSS and an initialization voltage VINT to the display panel 110. The power supply 180 may provide a first power voltage VGH and a second power voltage VGL to the emission driver 170 and the scan driver 200.

The scan driver 200 may apply a first scan signal, a second scan signal and a third scan signal to each of the pixels 111 through the first group of scan lines SL11 to SL1n, the second group of scan lines SL21 to SL2n and the third group of scan lines SL31 to SL3n based on a second driving control signal DCTL2. For example, the first scan signal may be a scan writing signal. For example, the second scan signal may be a scan initialization signal. For example, the third scan signal may be a scan bypass signal.

The data driver 150 may apply a data voltage to each of the pixels 111 through the plurality of data lines DL1 to DLm based on a first driving control signal DCTL1.

The emission driver 170 may apply an emission control signal to each of the pixels 111 through the plurality of emission control lines EL1 to ELn based on a third driving control signal DCTL3. Luminance of the display panel 110 may be configured based on the emission control signal.

The power supply 180 may provide the high power supply voltage ELVDD, the low power supply voltage ELVSS and the initialization voltage VINT to the display panel 110, and may provide the first power voltage VGH and the second power voltage VGL to the emission driver 170 and the scan driver 200, in response to a power control signal PCTL.

The timing controller 130 may receive input image data RGB and a control signal CTL, and may generate the first to third driving control signals DCTL1 to DCTL3 and the power control signal PCTL based on the control signal CTL. The timing controller 130 may provide the first driving control signal DCTL1 to the data driver 150, the second driving control signal DCTL2 to the scan driver 200, the third driving control signal DCTL3 to the emission driver 170 and the power control signal PCTL to the power supply 180. The timing controller 130 may generate the data signal DTA based on the input image data RGB. The timing controller 130 may provide the data signal DTA to the data driver 150.

Figure 2:
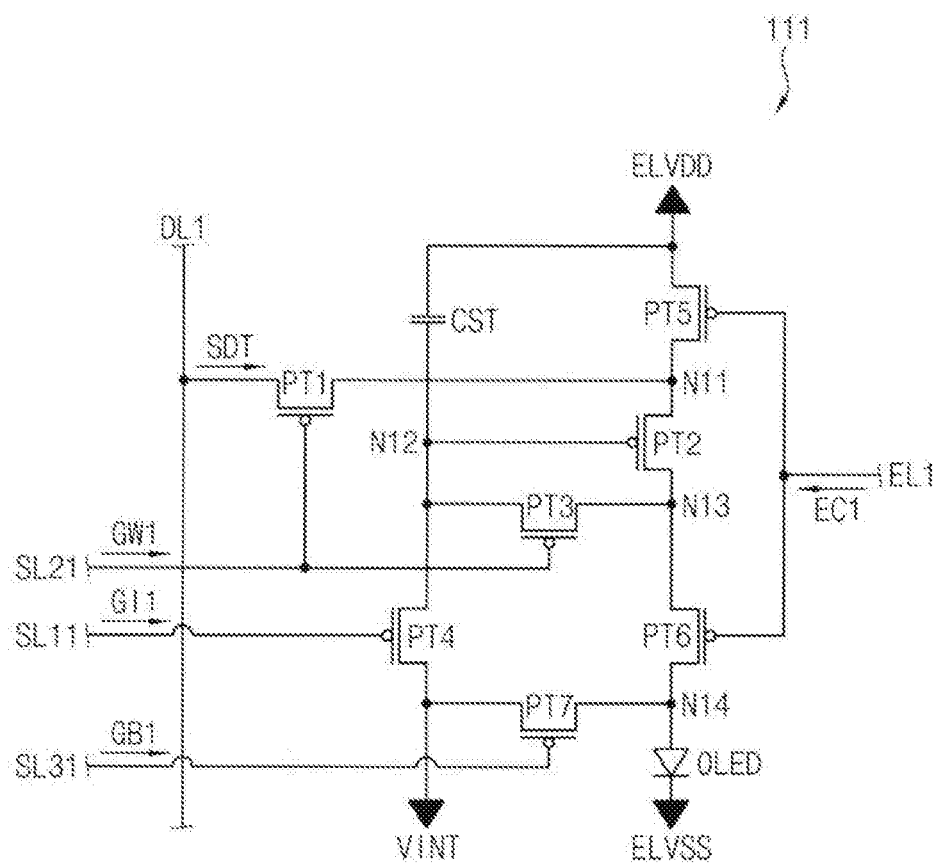
FIG. 2 is a circuit diagram illustrating a pixel of FIG. 1 according to an embodiment.

FIG. 2 is a circuit diagram illustrating the pixel 111 of FIG. 1.

In FIG. 2, the pixel 111 is connected to a first data line DL1, a first scan line SL11, a second scan line SL21, a third scan line SL31 and a first emission control line EL1.

Referring to FIGS. 1 and 2, the pixel 111 may be connected to the scan driver 200 through the first scan line SL11 of the first group of scan lines SL11 to SL1n, the second scan line SL21 of the second group of scan line SL21 to SL2n and the third scan line SL31 of the third group of scan lines SL31 to SL3n. The pixel 111 may be connected to the data driver 130 through the first data line DL1 of the data lines DL1 to DLm. The pixel 111 may be connected to the emission driver 170 through the first emission control line EL1 through a first emission control line EL1 of the emission control lines EL1 to ELn.

The pixel 111 may include a switching transistor PT1, a driving transistor PT2, a compensation transistor PT3, an initialization transistor PT4, first and second emission transistors PT5 and PT6, a discharge transistor PT7, a storage capacitor CST and an OLED.

The switching transistor PT1 may include a gate electrode connected to the second scan line SL21 and receiving the scan writing signal GW1, a source electrode connected to the first data line DL1 and receiving the data voltage SDT and a drain electrode connected to a first node N11. The switching transistor PT1 may be a p-channel metal-oxide semiconductor (PMOS) transistor.

The driving transistor PT2 may include a gate electrode connected to a second node N12, a source electrode connected to the first node N11 and a drain electrode connected to a third node N13. The driving transistor PT2 may be the PMOS transistor.

The compensation transistor PT3 may include a gate electrode connected to the second scan line SL21 and receiving the scan writing signal GW1, a source electrode connected to the second node N12 and a drain electrode connected to the third node N13. The compensation transistor PT3 may be the PMOS transistor.

The initialization transistor PT4 may include a gate electrode connected to the first scan line SL11 and receiving the scan initialization signal GI1, a source electrode connected to the second node N12 and a drain electrode to which the initialization voltage VINT is applied. The initialization transistor PT4 may be the PMOS transistor.

The first emission transistor PT5 may include a source electrode to which the high power supply voltage ELVDD is applied, a drain electrode connected to the first node N11 and a gate electrode connected to the first emission control line EL1 and receiving an emission control signal EC1. The first emission transistor PT5 may be the PMOS transistor.

The second emission transistor PT6 may include a source electrode connected to the third node N13, a drain electrode connected to a fourth node N14 and a gate electrode connected to the first emission control line EL1 and receiving the emission control signal EC1. The second emission transistor PT6 may be the PMOS transistor.

The discharge transistor PT7 may include a source electrode to which the initialization voltage VINT is applied, a drain electrode connected to the fourth node N14 and a gate electrode connected to the third scan line SL31 and receiving the scan bypass signal GB1. The discharge transistor PT7 may be the PMOS transistor.

The storage capacitor CST may include a first terminal to which the high power supply voltage ELVDD is applied and a second terminal connected to the second node N12.

The OLED may include an anode electrode connected to the fourth node N14 and a cathode electrode to which the low power supply voltage ELVSS is applied.

The switching transistor PT1 transmits the data voltage SDT to the storage capacitor CST in response to the scan writing signal GW1. The OLED may emit light in response to the data voltage SDT stored in the storage capacitor CST to display image.

In example embodiments, the pixels 111 of the display panel 110 may be driven in a digital driving method. In the digital driving method of the pixel 111, the driving transistor PT2 operates as a switch in a linear region. Accordingly, the driving transistor PT2 represents one of a turn on state and a turn off state.

To turn on or turn off the driving transistor PT2, the data voltage SDT having two levels including a turn on level and a turn off level is used. In the digital driving method, the pixel represents one of the turn on state and the turn off state so that a single frame may be divided into a plurality of subfields to represent various grayscales. The turn on state and the turn off state of the pixel 111 during each of the subfields are combined so that the various grayscales of the pixel may be represented.

The emission transistors PT5 and PT6 are turned on or turned off in response to the emission control signal EC1 to provide a current to the OLED or to block a current to the OLED. When the current to the OLED is provided, the OLED may emit. When the current to the OLED is blocked, the OLED may not emit. Therefore, the emission transistors PT5 and PT6 are turned on or turned off in response to the emission control signal EC1 to adjust a luminance of the display panel 110.

The compensation transistor PT3 may connect the second node N12 and the third node N13 in response to the scan writing signal GW1. The compensation transistor T3 may compensate for variance of threshold voltage of each driving transistor PT2 of each pixel of the display panel 110 when the image is displayed by diode-connecting the gate electrode and the drain electrode of the driving transistor PT2.

The initialization transistor PT4 may transfer the initialization voltage VINT to the second node N12 in response to the scan initialization signal GI1. The initialization transistor PT4 may initialize data voltage transferred to the driving transistor PT2 during a previous frame by transferring the initialization voltage VINT to the gate electrode of the driving transistor PT2.

The discharge transistor PT7 connects the fourth node N14 to the initialization voltage VINT in response to the scan bypass signal GB1 to discharge parasitic capacitance between the second emission transistor PT6 and the OLED. In an embodiment, the scan writing signal GW1 may be applied to the gate electrode of the discharge transistor PT7 instead of the scan bypass signal GB1. In an embodiment, the scan initialization signal GI1 may be applied to the gate electrode of the discharge transistor PT7 instead of the scan bypass signal GB1.

Figure 3:
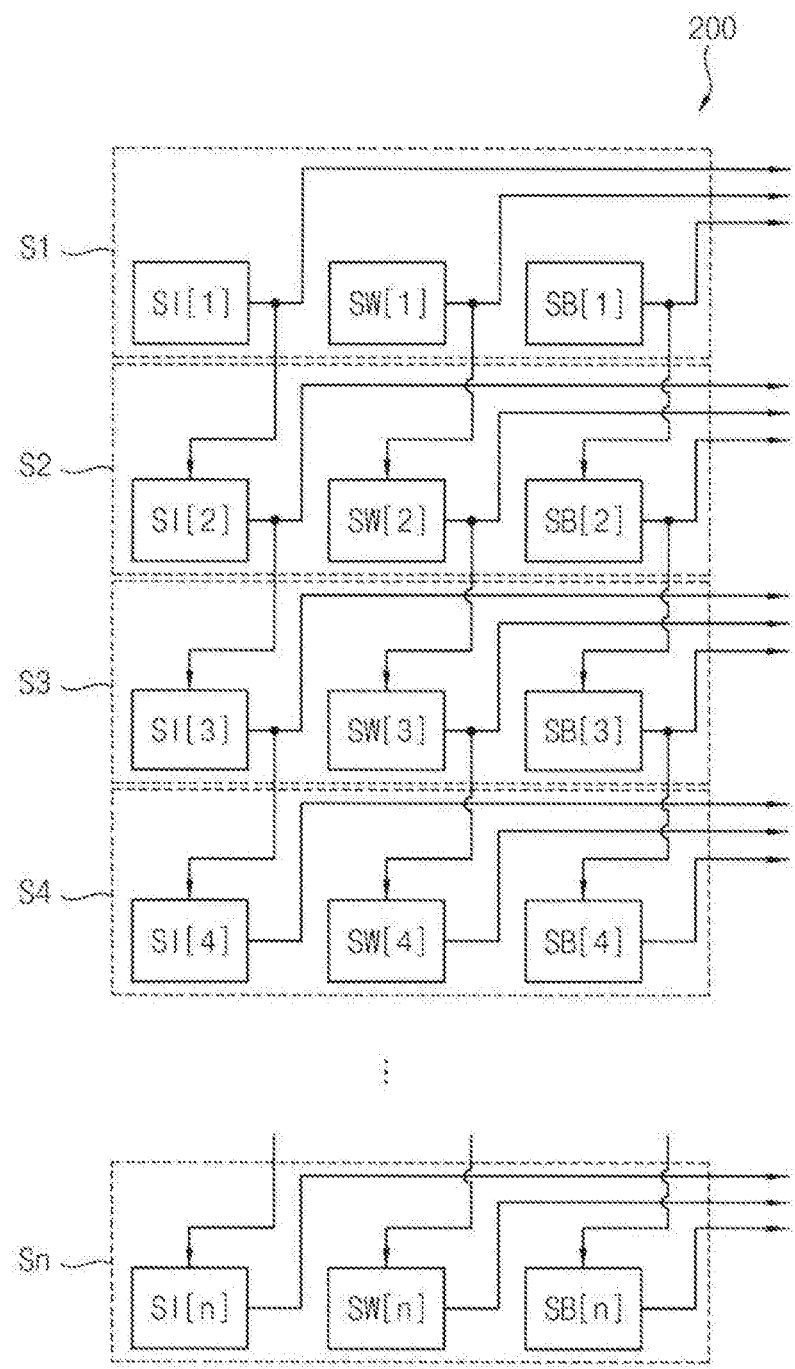
FIG. 3 is a block diagram illustrating a scan driver of FIG. 1 according to an embodiment.

FIG. 3 is a block diagram illustrating the scan driver 200 of FIG. 1.

Referring to FIG. 3, the scan driver 200 includes a plurality of stages S1 to Sn.

The stages S1 to Sn of the scan driver 200 provide scan signals to the pixels respectively connected to the stages S1 to Sn. For example, the stages S1 to Sn of the scan driver 200 may provide the scan writing signals GW, the scan initialization signals GI and scan bypass signals GB to the pixels respectively connected to the stages S1 to Sn.

The stages S1 to Sn may respectively include scan writing stages SW[1] to SW[n] outputting the scan writing signals, scan initialization stages SI[1] to SI[n] outputting the scan initialization signals and scan bypass stages SB[1] to SB[n] outputting the scan bypass signals.

Although the stage includes all of the scan writing stage, the scan initialization stage and the scan bypass stage to provide the scan writing signal GW, scan initialization signal GI and the scan bypass signal GB in an embodiment, embodiments are not limited thereto. Alternatively, the stage may not include one of the scan initialization stage and the scan bypass stage. When the stage does not include the scan initialization stage, the scan initialization signal may be one of the scan writing signal GW, scan initialization signal GI and the scan bypass signal GB of the other stage. When the stage does not include the scan bypass stage, the scan bypass signal may be one of the scan writing signal GW, scan initialization signal GI and the scan bypass signal GB of the other stage.

Figure 4:
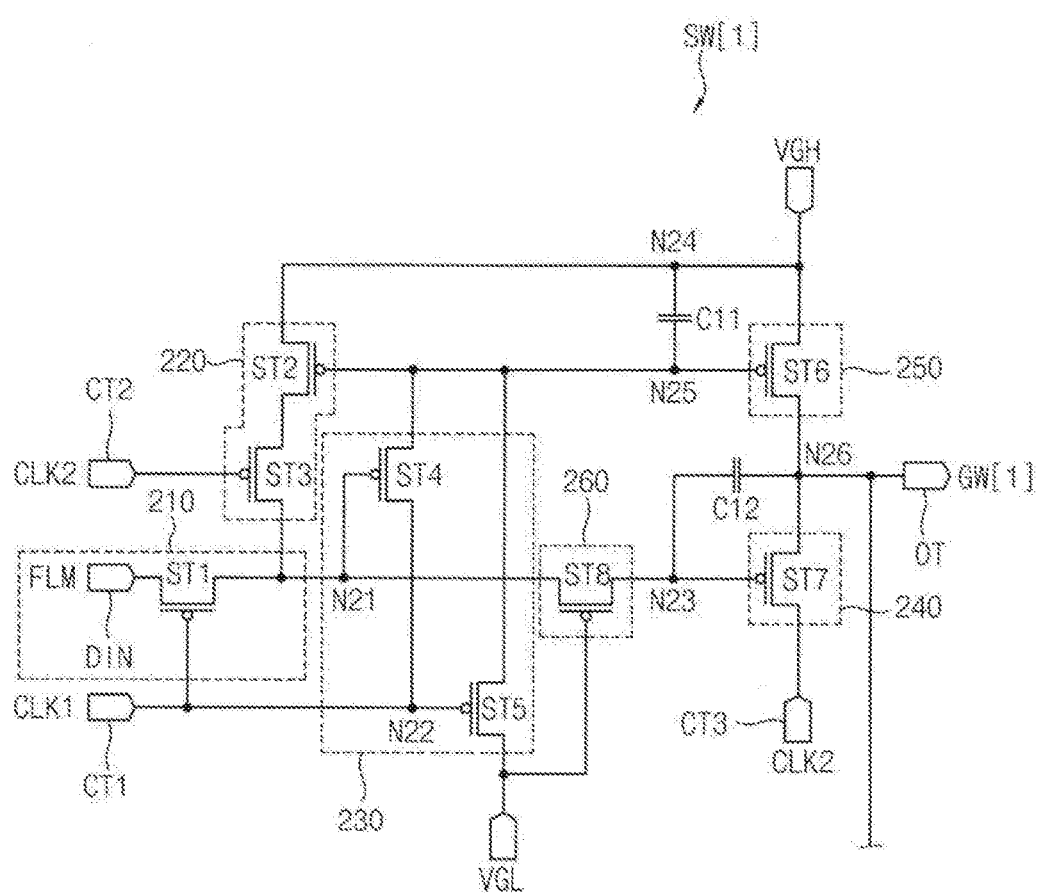
FIG. 4 is a circuit diagram illustrating a first scan writing stage of FIG. 3 according to an embodiment.
Figure 5:
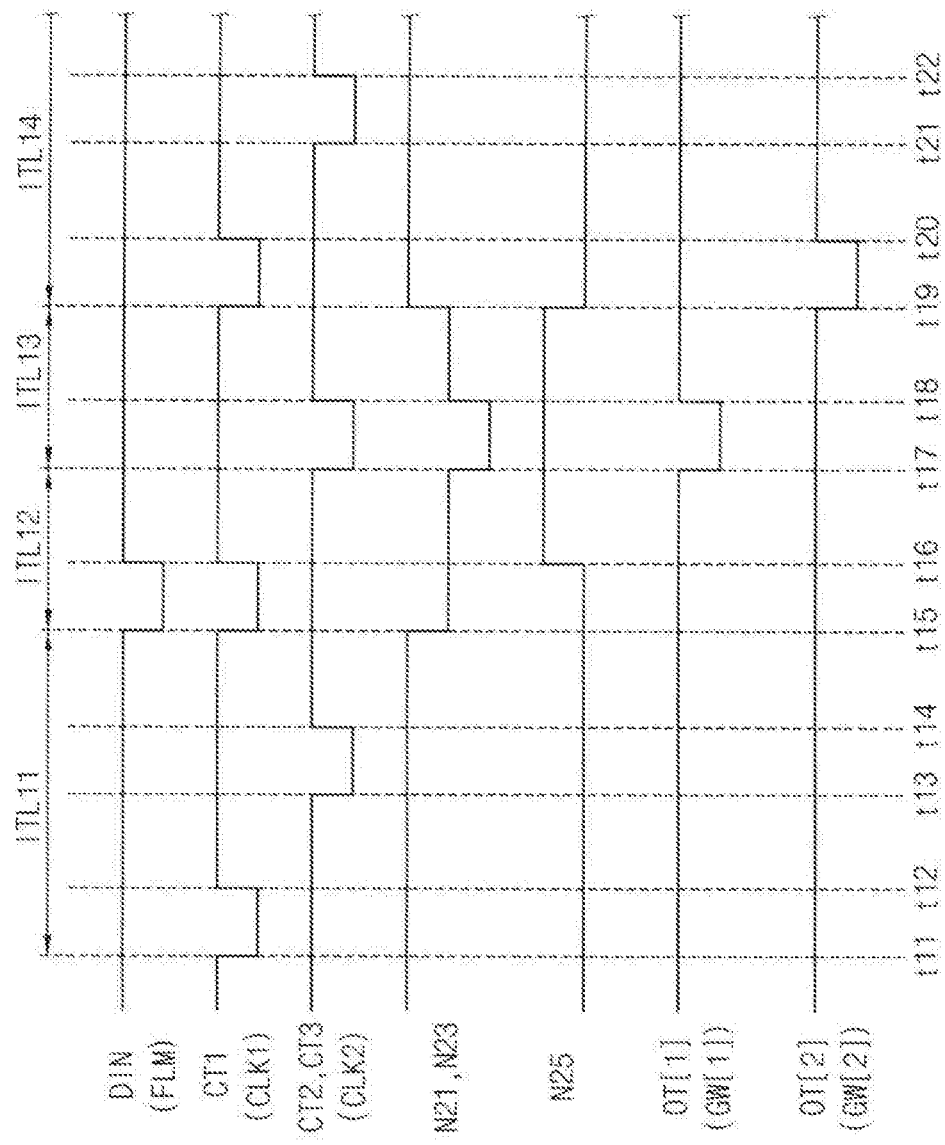
FIG. 5 is a timing diagram illustrating input signals, output signals and node signals of scan writing stages of FIG. 3 according to an embodiment.

FIG. 4 is a circuit diagram illustrating a first scan writing stage SW[1] of FIG. 3. FIG. 5 is a timing diagram illustrating input signals, output signals and node signals of scan writing stages SW[1] and SW[2] of FIG. 3.

Referring to FIGS. 3 to 5, the first scan writing stage SW[1] may include first to eighth transistors ST1 to ST8 and first and second capacitors C11 and C12.

The first scan writing stage SW[1] includes a pulse detecting part 210, a pull down control part 220, a pull up control part 230, a signal output part 240 and 250 and a stabilizing part 260. The signal output part 240 and 250 may include a pull down part 240 and a pull up part 250.

The pulse detecting part 210 detects a pulse of an input signal FLM in response to a first clock signal CLK1 and activates pull down control nodes N21 and N23. The input signal of the first scan writing stage SW[1] may be a start signal FLM. Input signals of second to n-th scan writing stages SW[2] to SW[n] may be the scan writing signals of one of previous stages.

The pull down control part 220 initializes the pull down control nodes N21 and N23 in response to a second clock signal CLK2.

The pull up control part 230 adjusts a signal of a pull up control node N25 in response to the first clock signal CLK1 and the signals of the pull down control nodes N21 and N23.

The signal output part 240 and 250 outputs the scan writing signal GW[1] in response to the signals of the pull down control nodes N21 and N23 and the signal of the pull up control node N25.

The pull down part 240 generates scan pulses of the first scan writing signal GW[1] in response to the signals of the pull down control nodes N21 and N23.

The pull up part 250 maintains a high level of the scan writing signal GW[1] in response to the signal of the pull up control node N25.

The stabilizing part 260 connects a first node N21 and a third node N23 in response to the second power voltage VGL. The signal of the third node N23 is the signal of the pull down control node to operate the pull down part 240. The first node N21 and the third node N23 are connected by the stabilizing part 260, so that both of the first node N21 and the third node N23 may be called to the pull down control node.

In the first scan writing stage SW[1], the first clock signal CLK1 is applied to a first clock terminal CT1, the second clock signal CLK2 is applied to a second clock terminal CT2 and the second clock signal CLK2 is applied to a third clock terminal CT3. In the second scan writing stage SW[2], the second clock signal CLK2 is applied to the first clock terminal CT1 unlike the first scan writing stage SW[1], the first clock signal CLK1 is applied to the second clock terminal CT2 and the third clock terminal CT3 unlike the first scan writing stage SW[1].

The clock signals applied to the first to third clock terminals CT1 to CT3 of odd-numbered scan writing stages may be the same as the clock signals applied to the first to third clock terminals CT1 to CT3 of the first scan writing stage SW[1]. The clock signals applied to the first to third clock terminals CT1 to CT3 of even-numbered scan writing stages may be the same as the clock signals applied to the first to third clock terminals CT1 to CT3 of the second scan writing stage SW[2].

The pulse detecting part 210 may include a first transistor ST1. The first transistor ST1 may include a gate electrode connected to the first clock terminal CT1, a source electrode to which the input signal FLM is applied and a drain electrode connected to the first node N21. The input signal FLM is provided through an input terminal DIN. The first transistor ST1 may be a PMOS transistor.

The pull down control part 220 may include a second transistor ST2 and a third transistor ST3. The second transistor ST2 may include a gate electrode connected to the pull up control node N25, a source electrode to which the first power voltage VGH is applied and a drain electrode connected to a source electrode of the third transistor ST3. The second transistor ST2 may be a PMOS transistor. The third transistor ST3 may include a gate electrode connected to the second clock terminal CT2, a source electrode connected to the drain electrode of the second transistor ST2 and a drain electrode connected to the first node N21. The third transistor ST3 may be a PMOS transistor.

The pull up control part 230 may include a fourth transistor ST4 and a fifth transistor ST5. The fourth transistor ST4 may include a gate electrode connected to the first node N21, a source electrode connected to the gate electrode of the second transistor ST2 and a drain electrode connected to a second node N22. The second node N22 is connected to the first clock terminal CT1. The fourth transistor ST4 may be a PMOS transistor. The fifth transistor ST5 may include a gate electrode connected to the second node N22, a source electrode connected to the gate electrode of the second transistor ST2 and a drain electrode to which the second power voltage VGL is applied. The fifth transistor ST5 may be a PMOS transistor.

The pull down part 240 may include a seventh transistor ST7. The seventh transistor ST7 may be a first output transistor. The first output transistor ST7 may include a gate electrode connected to the pull down control node N23, a source electrode connected to an output node N26 and a drain electrode connected to the third clock terminal CT3. The output node N26 is connected to an output terminal OT. The seventh transistor ST7 may be a PMOS transistor.

The pull up part 250 may include a sixth transistor ST6. The sixth transistor ST6 may be a second output transistor. The second output transistor ST6 may include a gate electrode connected to the gate electrode of the second transistor ST2, a source electrode to which the first power voltage VGH is applied and a drain electrode connected to the output node N26. The sixth transistor ST6 may be a PMOS transistor.

The stabilizing part 260 may include an eighth transistor ST8. The eighth transistor ST8 includes a gate electrode to which the second power voltage VGL is applied, a source electrode connected to the first node N21 and a drain electrode connected to the third node N23. The eighth transistor ST8 may be a PMOS transistor.

The first capacitor C11 includes a first end connected to a first voltage applying node N24 and a second end connected to the pull up control node N25. The second capacitor C12 includes a first end connected to the third node N23 and a second end connected to the output node N26.

The level of the first power voltage VGH is greater than the level of the second power voltage VGL.

an The scan initialization stages SI[1] to SI[n] and the scan bypass stages SB[1] to SB[n] may have structures substantially the same as and/or analogous to structures of the scan writing stages SW[1] to SW[n].

FIG. 5 represents the input signals FLM, CLK1, CLK2 of the first scan writing stage SW[1] and the output signal GW[1] of the first scan writing stage SW[1] and the output signal GS[2] of the second scan writing stage SW[2] which is adjacent to the first scan writing stage SW[1].

The start signal FLM is activated to a low level between t15 and t16. The first clock signal CLK1 is respectively activated between t11 and t12, between t15 and t16 and between t19 and t20. The second clock signal CLK2 is respectively activated between t13 and t14, between t17 and t18 and between t21 and t22. The pull down control nodes N21 and N23 are activated between t17 and t18. The pull up control nodes N25 is maintained at a high level between t16 to t19. The output signal GW[1] of the output terminal OT[1] of the first scan writing stage is activated between t17 and t18. The output signal GW[2] of the output terminal OT[2] of the second scan writing stage is activated between t19 and t20.

Time period between t11 to t15 may be an initialization time ITL11. Time period between t15 to t17 may be a detecting time ITL12. Time period between t17 to t19 may be an output time ITL13. Time period on and after t20 may be a second initialization time ITL14.

On t11, when the first clock signal CLK1 becomes a low level, the first transistor ST1 is turned on so that the pull down control nodes N21 and N23 are initialized to a high level by a high level of the input signal FLM. In addition, the fifth transistor ST5 is turned on so that the pull up control node N25 is initialized to a low level by a low level of the second power voltage VGL.

On t13, when the second clock signal CLK2 becomes a low level, the third transistor ST3 is turned on and the second transistor ST2 maintains a turn on status so that the pull down control nodes N21 and N23 are initialized to a high level by a high level of the first power voltage VGH.

On t15, when the first clock signal CLK1 becomes a low level and the input signal FLM becomes a low level, the first transistor ST1 is turned on so that the pull down control nodes N21 and N23 becomes a low level by a low level of the input signal FLM.

On t16, when the first clock signal CLK1 becomes a high level and the pull down control nodes N21 and N23 maintain a low level, the fourth transistor M4 is turned on in response to a signal of the pull down control nodes N21 and N23 so that the pull up control node N25 becomes a high level.

On t17, when the second clock signal CLK2 becomes a low level, the state of the second clock signal CLK2 transmitted to the output terminal OT[1] due to bootstrapping of the second capacitor C12. Thus, the pull down control nodes N21 and N23 have a low level and the second clock signal CLK2 has a low level so that the output terminal OT[1] outputs the scan pulse having a low level.

On t19, when the first clock signal CLK1 becomes a low level, the pull down control nodes N21 and N23 are initialized to a high level and the pull up control node N25 is initialized to a low level like on t11.

On t21, when the second clock signal CLK2 becomes a low level, the pull down control nodes N21 and N23 are initialized to a high level like on t13.

After t21, the above explained initialized status is maintained before the input signal FLM becomes the low level. For example, when a low level of the input signal FLM is detected in a next frame, the first scan writing stage SW[1] may output the scan pulse having a low level in a way explained on t17.

Figure 6A:
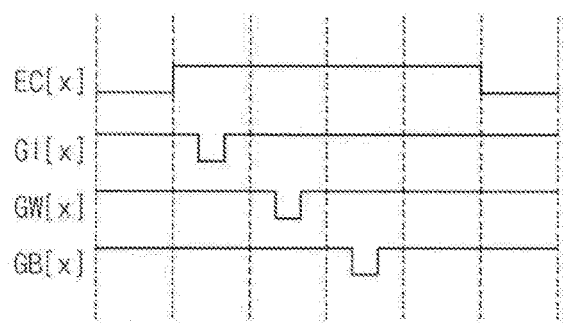
FIG. 6A is a timing diagram illustrating driving signals applied to a pixel in stage x when the scan driver of FIG. 1 is driven in a normal driving method according to an embodiment.
Figure 6B:
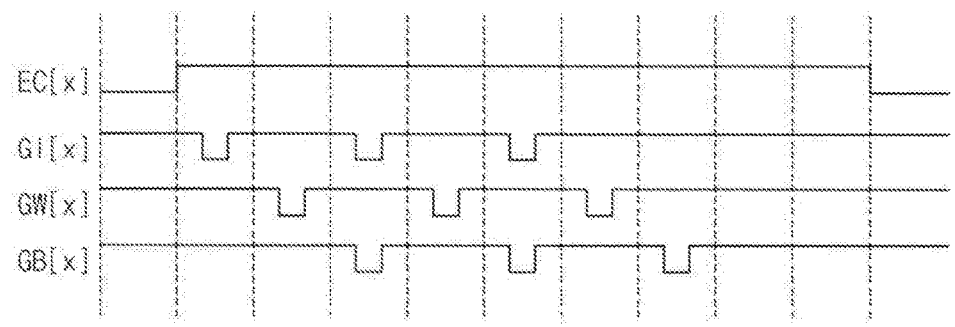
FIG. 6B is a timing diagram illustrating driving signals applied to the pixel in stage x when the scan driver of FIG. 1 is driven in a 3-CLK driving method according to an embodiment.

FIG. 6A is a timing diagram illustrating driving signals applied to a pixel in stage x when the scan driver 200 of FIG. 1 is driven in a normal driving method. FIG. 6B is a timing diagram illustrating driving signals applied to the pixel in stage x when the scan driver 200 of FIG. 1 is driven in a 3-CLK driving method.

In the normal driving method of FIG. 6A, a single scan writing pulse is outputted to a single scan writing line during a frame. The scan writing signal, the scan writing signal and the scan bypass signal may be applied to the pixel of FIG. 2.

Thus, in the normal driving method, a scan writing signal GW[x] outputted to a first scan line of an x-th stage has a single scan writing pulse during a frame. Similarly, in the normal driving method, a scan initialization signal GI[x] outputted to a second scan line of the x-th stage has a single scan initialization pulse during a frame. Similarly, in the normal driving method, a scan bypass signal GB[x] outputted to a third scan line of the x-th stage has a single scan initialization pulse during a frame.

In the normal driving method, when the pixel 111 displays white image right after black image, the pixel 111 may represent luminance less than desired luminance according to a characteristic of the driving transistor of the pixel 111.

To compensate the luminance, at least two scan writing pulses may be outputted to a single scan writing line during a frame. The driving transistor of the pixel 111 is turned on and turned off in plural times so that the pixel 111 may represent the desired luminance accurately.

In FIG. 6B, the 3-CLK driving method is explained. In the 3-CLK driving method, three scan writing pulses are outputted to a single scan writing line during a frame. The scan writing signal, the scan initial signal and the scan bypass signal may be applied to the pixel 111 of FIG. 2.

Thus, in the 3-CLK driving method, a scan writing signal GW[x] outputted to a first scan line of an x-th stage has three scan writing pulses during a frame. Similarly, in the 3-CLK driving method, a scan initialization signal GI[x] outputted to a second scan line of the x-th stage has three scan initialization pulses during a frame. Similarly, in the 3-CLK driving method, a scan bypass signal GB[x] outputted to a third scan line of the x-th stage has three scan initialization pulses during a frame.

In the 3-CLK driving method, an emission control signal EC[x] has activation duration longer than that of the normal driving method.

According to the explained above, three scan pulses are applied to the single scan writing line during a frame so that the pixel 111 may represent the desired luminance accurately compared to the normal driving method.

Figure 7:
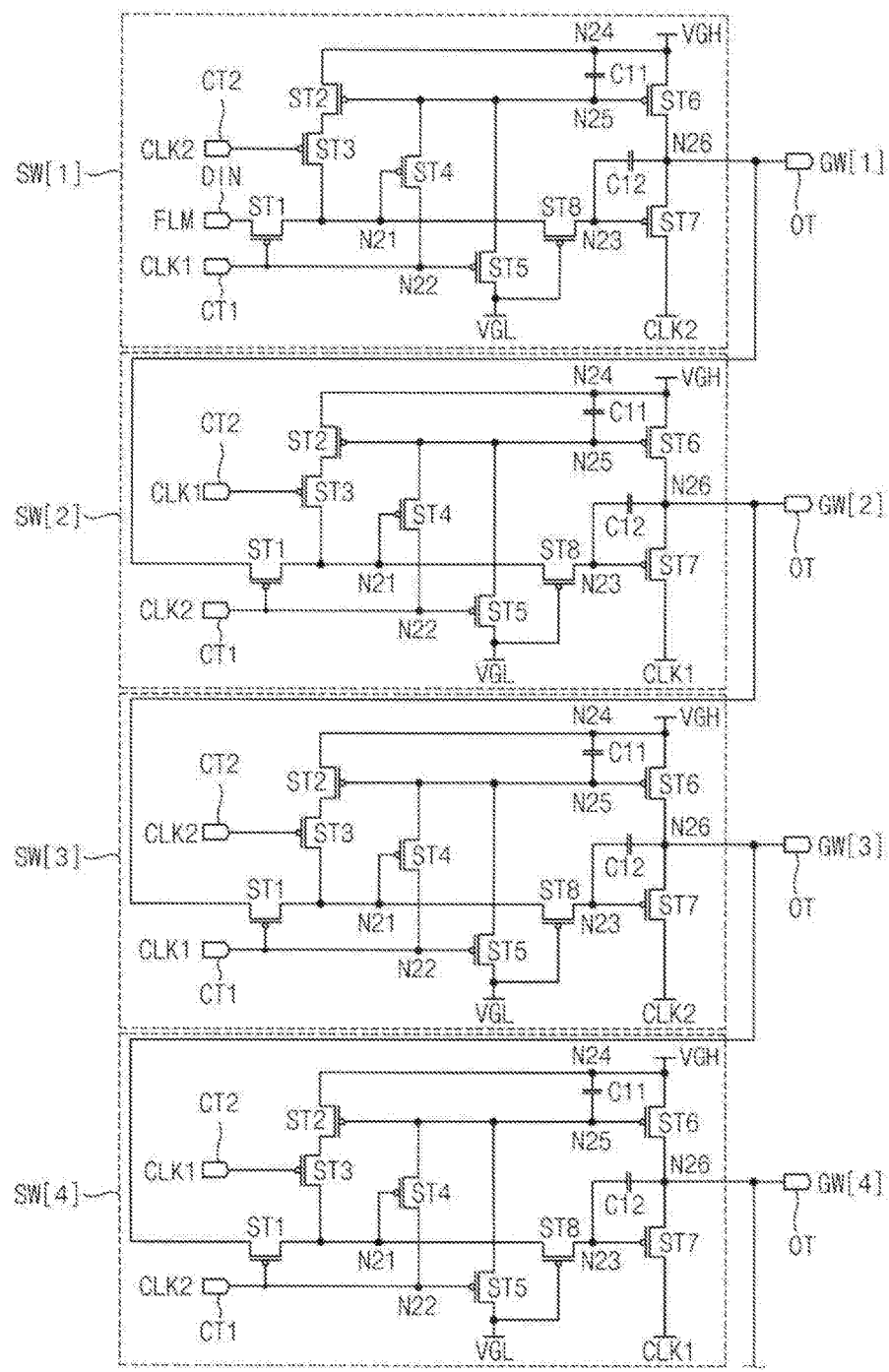
FIG. 7 is a circuit diagram illustrating first to fourth scan writing stages of FIG. 3 according to an embodiment.
Figure 8A:
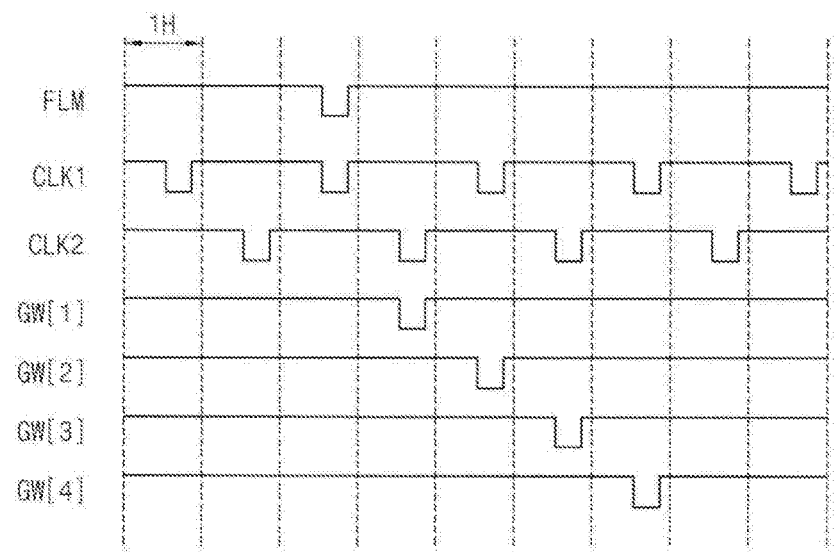
FIG. 8A is a timing diagram illustrating scan writing signals applied to the scan writing stages when the scan driver of FIG. 1 is driven in the normal driving method according to an embodiment.
Figure 8B:
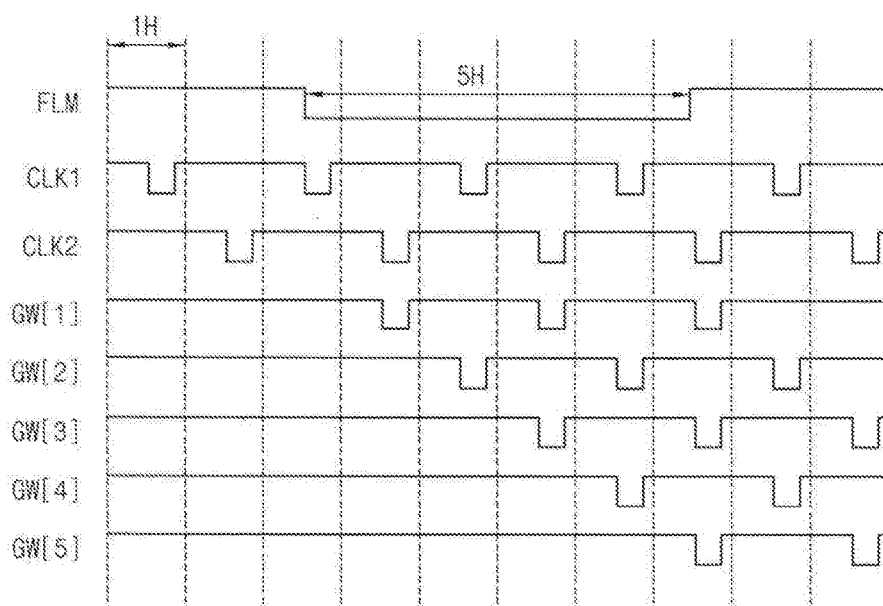
FIG. 8B is a timing diagram illustrating scan writing signals applied to the scan writing stages when the scan driver of FIG. 1 is driven in the 3-CLK driving method according to an embodiment.

FIG. 7 is a circuit diagram illustrating first to fourth scan writing stages SW[1] to SW[4] of FIG. 3. FIG. 8A is a timing diagram illustrating scan writing signals applied to the scan writing stages when the scan driver 200 of FIG. 1 is driven in the normal driving method. FIG. 8B is a timing diagram illustrating scan writing signals applied to the scan writing stages when the scan driver 200 of FIG. 1 is driven in the 3-CLK driving method.

Referring to FIG. 7, the input signal of the first scan writing stage SW[1] is the start signal FLM. The input signal of the second scan writing stage SW[2] is the output signal GW[1] of the first scan writing stage SW[1]. The input signal of the third scan writing stage SW[3] is the output signal GW[2] of the second scan writing stage SW[2]. The input signal of the fourth scan writing stage SW[4] is the output signal GW[3] of the third scan writing stage SW[3].

The first clock signal CLK1 is applied to the first clock terminals CT1 of the first scan writing stage SW[1] and the third scan writing stage SW[3]. The second clock signal CLK2 is applied to the second and third clock terminals CT2 and CT3 of the first scan writing stage SW[1] and the third scan writing stage SW[3].

The second clock signal CLK2 is applied to the first clock terminals CT1 of the second scan writing stage SW[2] and the fourth scan writing stage SW[4]. The first clock signal CLK1 is applied to the second and third clock terminals CT2 and CT3 of the second scan writing stage SW[2] and the fourth scan writing stage SW[4].

Referring to FIG. 8A, in the normal driving method, the scan writing stage outputs a single scan writing pulse during a frame. The first scan writing signal GW[1] and the third scan writing signal GW[3] have the scan writing pulse corresponding to the second clock signal CLK2. The second scan writing signal GW[2] and the fourth scan writing signal GW[4] have the scan writing pulse corresponding to the first clock signal CLK1.

Referring to FIG. 8B, in the 3-CLK driving method, the scan writing stage outputs three scan writing pulses during a frame. The start signal FLM applied to the first scan writing stage has a low level duration longer than a low level duration of the start signal FLM in the normal driving method to operate the 3-CLK driving method. For example, the start signal FLM applied to the first scan writing stage may have the low level duration of five horizontal cycles 5H to operate the 3-CLK driving method.

In the normal driving method, a single clock pulse corresponds to a single scan writing pulse of a single scan writing line. However, in the 3-CLK driving method, a single clock pulse corresponds to three scan writing pulses of three scan writing lines. As shown in an eighth horizontal cycle of FIG. 8B, first, third and fifth scan writing signals generate scan writing pulses corresponding to the low level of the second clock signal CLK2.

Figure 9:
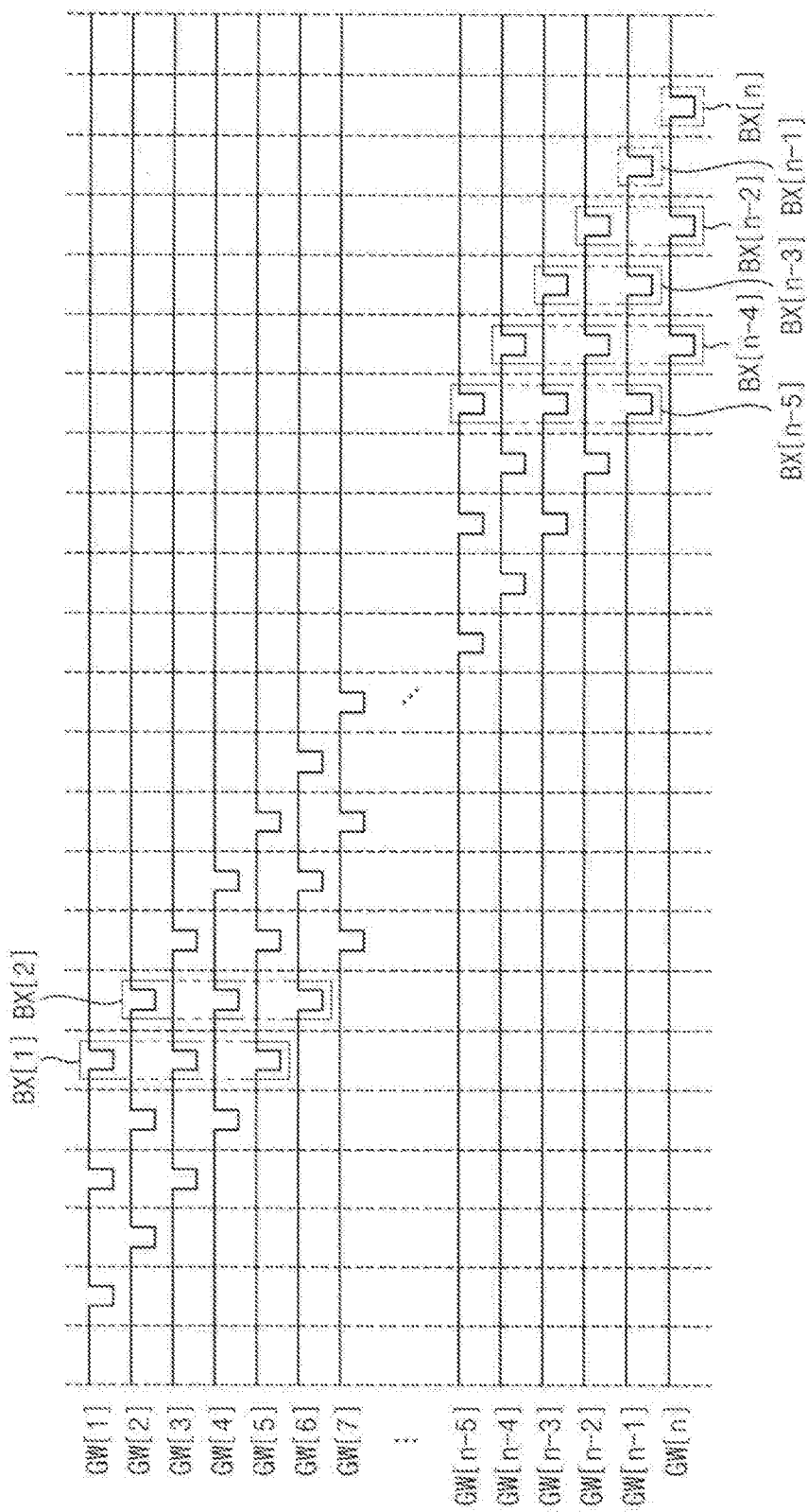
FIG. 9 is a timing diagram illustrating scan writing signals applied to all of the scan writing stages when the scan driver of FIG. 1 is driven in the 3-CLK driving method according to an embodiment.
Figure 10:
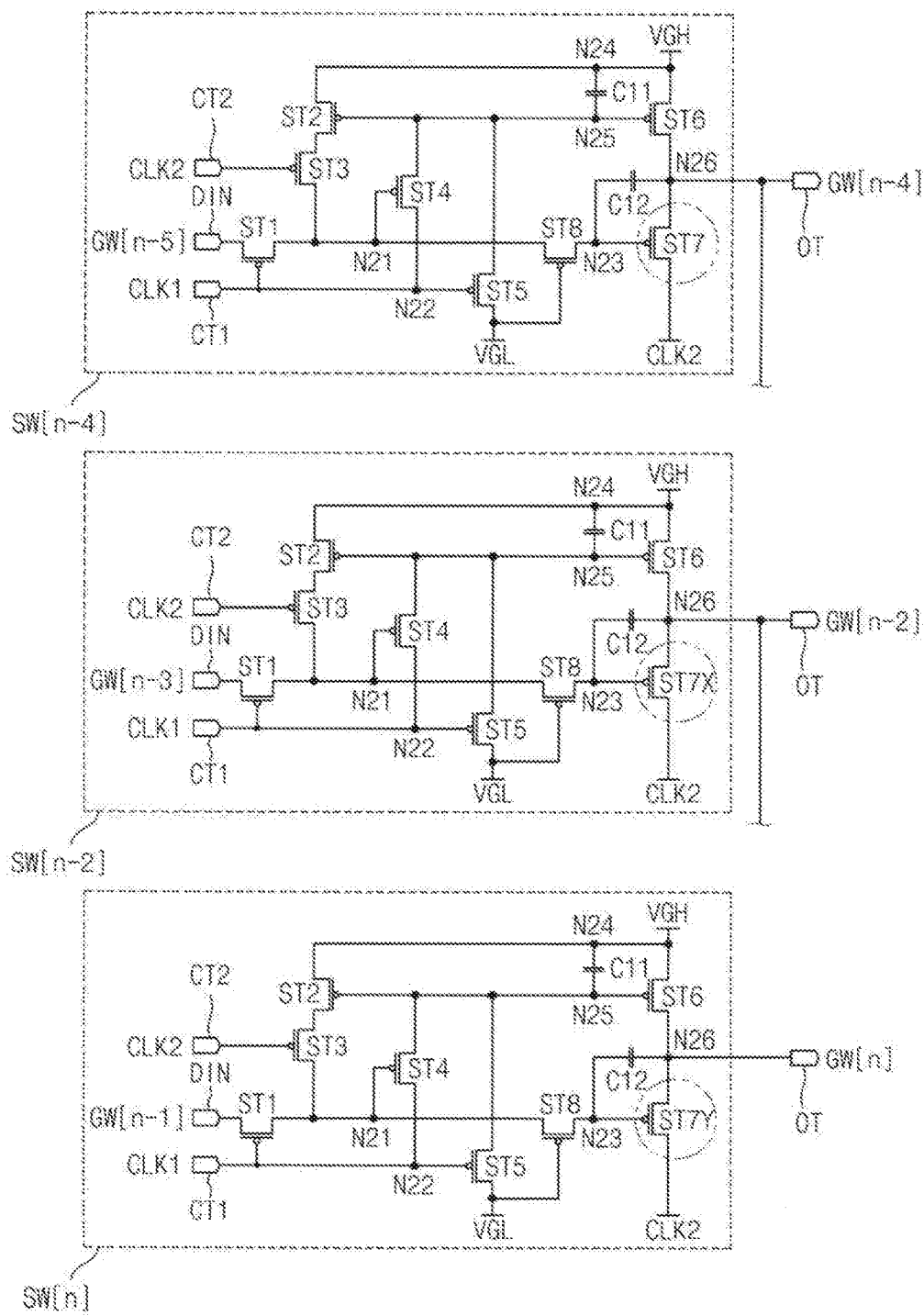
FIG. 10 is a circuit diagram illustrating (n−4)-th, (n−2)-th and n-th scan writing stages of the scan driver of FIG. 1 according to an embodiment.
Figure 11:
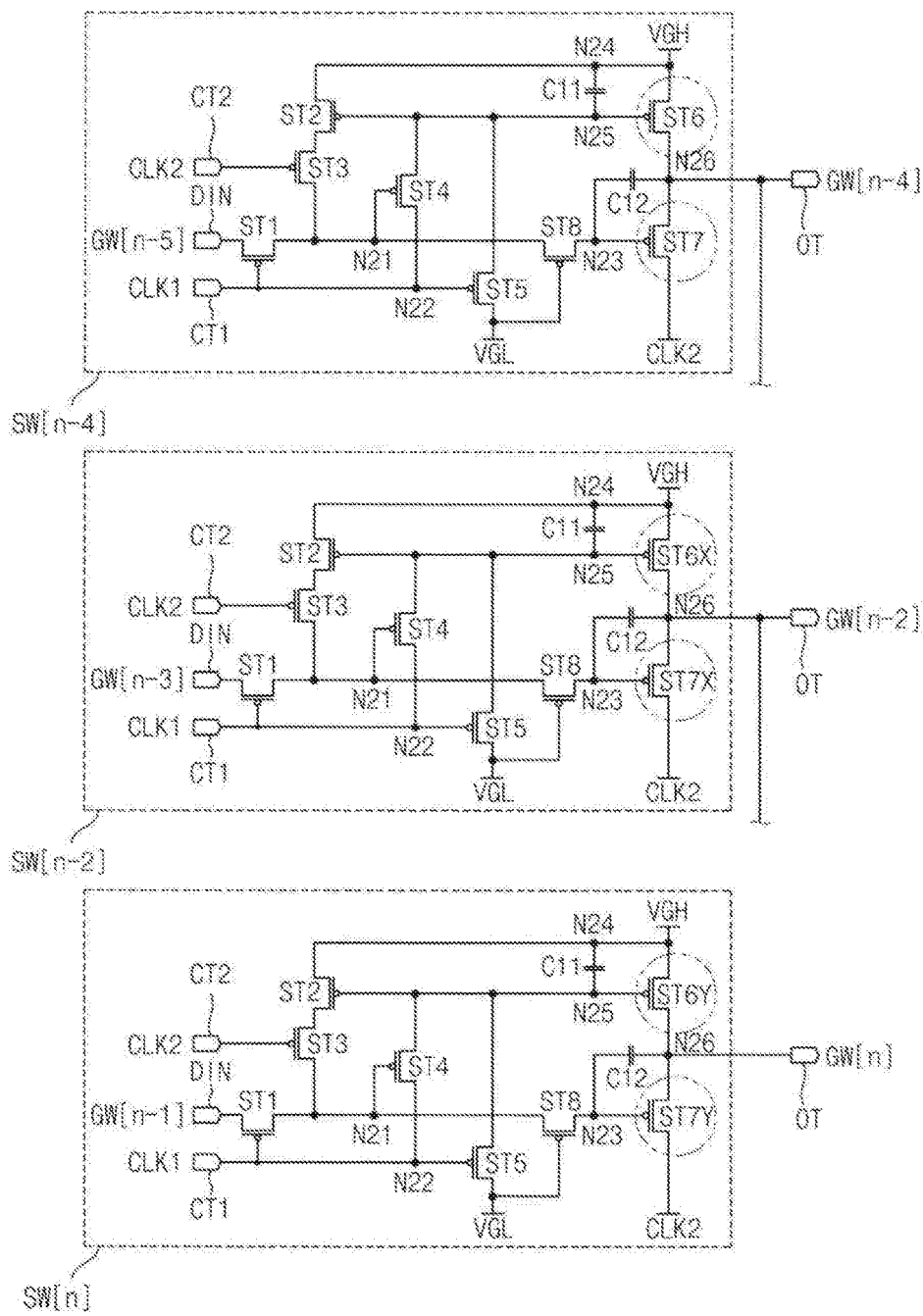
FIG. 11 is a circuit diagram illustrating (n−4)-th, (n−2)-th and n-th scan writing stages of a scan driver according to an embodiment according to an embodiment.
Figure 12A:
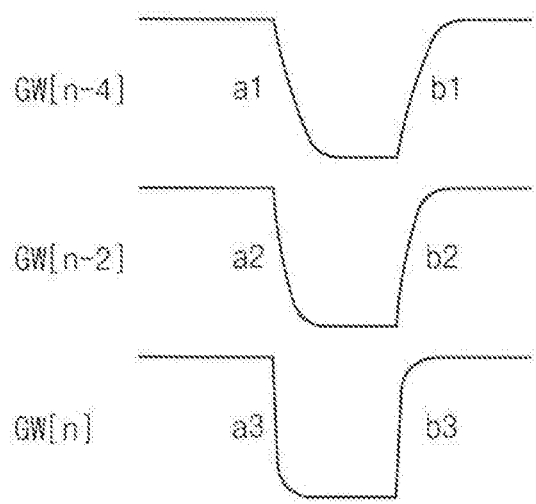
FIG. 12A is a waveform diagram illustrating (n−4)-th, (n−2)-th and n-th scan writing signals when the buffer size of the (n−4)-th, (n−2)-th and n-th scan writing stages are equal according to an embodiment.
Figure 12B:
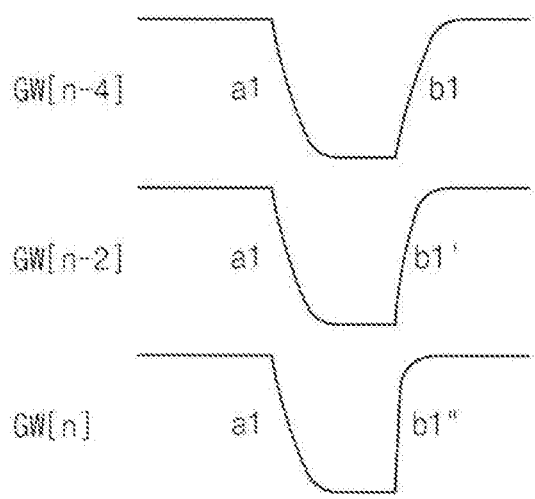
FIG. 12B is a waveform diagram illustrating (n−4)-th, (n−2)-th and n-th scan writing signals of the (n−4)-th, (n−2)-th and n-th scan writing stages of FIG. 10 according to an embodiment.
Figure 12C:
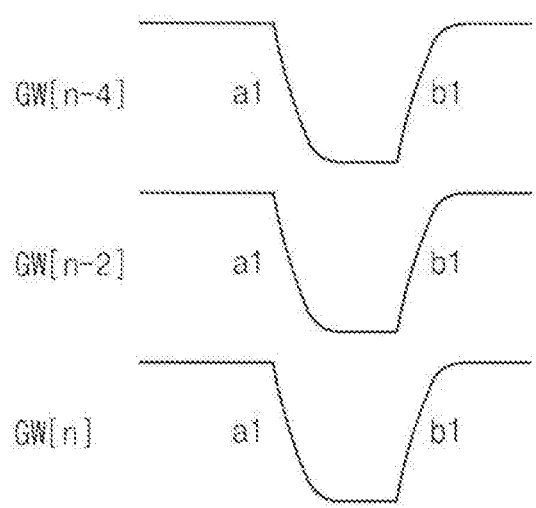
FIG. 12C is a waveform diagram illustrating (n−4)-th, (n−2)-th and n-th scan writing signals of the (n−4)-th, (n−2)-th and n-th scan writing stages of FIG. 11 according to an embodiment.

FIG. 9 is a timing diagram illustrating scan writing signals applied to all of the scan writing stages when the scan driver 200 of FIG. 1 is driven in the 3-CLK driving method. FIG. 10 is a circuit diagram illustrating (n−4)-th, (n−2)-th and n-th scan writing stages of the scan driver 200 of FIG. 1. FIG. 11 is a circuit diagram illustrating (n−4)-th, (n−2)-th and n-th scan writing stages of a scan driver 200 according to an embodiment. FIG. 12A is a waveform diagram illustrating (n−4)-th, (n−2)-th and n-th scan writing signals when the buffer sizes of the (n−4)-th, (n−2)-th and n-th scan writing stages are equal. FIG. 12B is a waveform diagram illustrating (n−4)-th, (n−2)-th and n-th scan writing signals of the (n−4)-th, (n−2)-th and n-th scan writing stages of FIG. 10. FIG. 12C is a waveform diagram illustrating (n−4)-th, (n−2)-th and n-th scan writing signals of the (n−4)-th, (n−2)-th and n-th scan writing stages of FIG. 11.

Referring to FIG. 9, for example, the scan driver may include n stages. The n-th stage may mean the last stage. The display panel 110 may include n pixel rows corresponding to the n stages.

In the 3-CLK driving method, the scan writing signal applied to the scan writing line has three scan writing pulses. When the third scan writing pulse among the three scan writing pulses is applied to the pixel 111 may mean a data writing time.

As shown in a first box BX[1], when the third scan writing pulse of the first scan writing signal GW[1] is applied to the pixel 111, three scan writing pulses of GW[1], GW[3] and GW[5] may be simultaneously generated based on a single clock pulse.

Similarly, as shown in a second box BX[2], when the third scan writing pulse of the second scan writing signal GW[2] is applied to the pixel 111, three scan writing pulses of GW[2], GW[4] and GW[6] may be simultaneously generated based on a single clock pulse.

Similarly, as shown in an (n−5)-th box BX[n−5], when the third scan writing pulse of the (n−5)-th scan writing signal GW[n−5] is applied to the pixel 111, three scan writing pulses of GW[n−5], GW[n−3] and GW[n−1] may be simultaneously generated based on a single clock pulse.

Similarly, as shown in an (n−4)-th box BX[n−4], when the third scan writing pulse of the (n−4)-th scan writing signal GW[n−4] is applied to the pixel 111, three scan writing pulses of GW[n−4], GW[n−2] and GW[n] may be simultaneously generated based on a single clock pulse.

However, as shown in an (n−3)-th box BX[n−3], when the third scan writing pulse of the (n−3)-th scan writing signal GW[n−3] is applied to the pixel 111, two scan writing pulses of GW[n−3] and GW[n−1] may be simultaneously generated based on a single clock pulse.

Similarly, as shown in an (n−2)-th box BX[n−2], when the third scan writing pulse of the (n−2)-th scan writing signal GW[n−2] is applied to the pixel 111, two scan writing pulses of GW[n−2] and GW[n] may be simultaneously generated based on a single clock pulse.

However, as shown in an (n−1)-th box BX[n−1], when the third scan writing pulse of the (n−1)-th scan writing signal GW[n−1] is applied to the pixel 111, the scan writing pulse of GW[n−1] may be generated based on a single clock pulse.

Similarly, as shown in an n-th box BX[n], when the third scan writing pulse of the n-th scan writing signal GW[n] is applied to the pixel 111, the scan writing pulse of GW[n] may be generated based on a single clock pulse.

In an embodiment, when the third pulse of each scan writing signal is applied, three scan writing pulses are simultaneously generated in the first to (n−4)-th scan writing signals. When the third pulse of each scan writing signal is applied, two scan writing pulses are simultaneously generated in the (n−3)-th and (n−2)-th scan writing signals. When the third pulse of each scan writing signal is applied, a single scan writing pulse is generated in the (n−1)-th and n-th scan writing signals.

In an embodiment, the stages have transistors with substantially identical structures. In this case, the third pulses of the first to (n−4)-th scan writing signals are used by three stages so that rising and falling of the third pulses of the first to (n−4)-th scan writing signals may become slow. However, the third pulses of the (n−3)-th and (n−2)-th scan writing signals are used by two stages so that rising and falling of the third pulses of the (n−3)-th and (n−2)-th scan writing signals may be faster than the rising and falling of the third pulses of the first to (n−4)-th scan writing signals. When the rising and falling of the third pulses of the (n−3)-th and (n−2)-th scan writing signals are faster than the rising and falling of the third pulses of the first to (n−4)-th scan writing signals, the data voltages applied to the pixels connected to the (n−3)-th and (n−2)-th stages increase so that the pixels connected to the (n−3)-th and (n−2)-th stages display relatively low luminance. In addition, the third pulses of the (n−1)-th and n-th scan writing signals are used by only a single stage so that rising and falling of the third pulses of the (n−1)-th and n-th scan writing signals may be faster than the rising and falling of the third pulses of the (n−3)-th and (n−2)-th scan writing signals. When the rising and falling of the third pulses of the (n−1)-th and n-th scan writing signals are faster than the rising and falling of the third pulses of the (n−3)-th and (n−2)-th scan writing signals, the data voltages applied to the pixels connected to the (n−1)-th and n-th stages increase so that the pixels connected to the (n−1)-th and n-th stages display relatively low luminance.

Therefore, the image at an end portion of the display panel 110 may be darker.

The differences of the scan writing signals of the (n−4)-th stage, the (n−2)-th stage and the n-th stage are shown in FIG. 12A when the stages have transistors with substantially identical structures. When the third pulse of GW[n−4] is generated, the clock pulse is commonly used by three different stages so that the rising and falling (a1 and b1) of the third pulse of the (n−4)-th scan writing signal is relatively slow. When the third pulse of GW[n−2] is generated, the clock pulse is commonly used by two different stages so that the rising and falling (a2 and b2) of the third pulse of the (n−2)-th scan writing signal is faster than the rising and falling (a1 and b1) of third pulse of GW[n−4]. When the third pulse of GW[n] is generated, the clock pulse is used by a single stage so that the rising and falling (a3 and b3) of the third pulse of the n-th scan writing signal is faster than the rising and falling (a2 and b2) of third pulse of GW[n−2].

Referring to FIG. 7 and FIG. 10, sizes (e.g., buffer sizes) of the transistors ST7 of the pull down parts 240 of four stages at the end portion of the display panel 110 may be different in an embodiment.

A first output transistor ST7 of the (n−4)-th scan writing stage SW[n−4] may have a first buffer size. The first output transistor ST7 may be a transistor of the pull down part 240.

A first output transistor ST7X of the (n−2)-th scan writing stage SW[n−2] may have a buffer size unequal to the buffer size of the first output transistor ST7 of the (n−4)-th scan writing stage SW[n−4]. The first output transistor ST7X of the (n−2)-th scan writing stage SW[n−2] may have a second buffer size. The second buffer size may be less than the first buffer size.

A first output transistor ST7Y of the n-th scan writing stage SW[n] may have a buffer size unequal to the buffer size of the first output transistor ST7X of the (n−2)-th scan writing stage SW[n−2]. The first output transistor ST7Y of the n-th scan writing stage SW[n] may have a third buffer size. The third buffer size may be less than the second buffer size.

The buffer sizes of the first output transistors of the first to (n−5)-th scan writing stages may be substantially the same as the buffer size of the first output transistor ST7 of the (n−4)-th scan writing stage.

The buffer size of the first output transistor of the (n−3)-th scan writing stage may be substantially the same as the buffer size of the first output transistor ST7X of the (n−2)-th scan writing stage.

The buffer size of the first output transistor of the (n−1)-th scan writing stage may be substantially the same as the buffer size of the first output transistor ST7Y of the n-th scan writing stage.

For example, the buffer size of the first output transistor may be a width-to-length ratio (W/L) of the first output transistor.

The waveforms of the scan writing signals of the (n−4)-th stage, the (n−2)-th stage and the n-th stage are shown in FIG. 12B when the buffer sizes of the transistors of the (n−3)-th to n-th scan writing stages are unequal as discussed with reference to FIG. 10.

In FIG. 12B, the buffer sizes of the output transistors ST7, ST7X AND ST7Y of the pull down parts are properly configured, so that the signals GW[n−4], GW[n−2] and GW[n] have similar waveforms to one another. For example, the falling waveforms a1, a1 and a1 of the signals GW[n−4], GW[n−2] and GW[n] may be substantially the identical to one another. When the buffer sizes of the output transistors ST7, ST7X AND ST7Y of the pull down parts are properly configured, the waveforms a1, a1 and a1 of the scan writing signals GW[n−4], GW[n−2] and GW[n] corresponding to the pull down portion may be configured to be substantially identical to one another. In addition, when the buffer sizes of the output transistors ST7, ST7X AND ST7Y of the pull down parts are properly configured, the waveforms b1, b1' and b1" of the scan writing signals GW[n−4], GW[n−2] and GW[n] corresponding to the pull up portion may be configured to be similar to one another.

Referring to FIG. 7 and FIG. 11, sizes (e.g., buffer sizes) of the transistors ST7 of the pull down parts 240 and sizes (e.g., buffer sizes) of the transistors ST6 of the pull up parts 250 of four stages at the end portion of the display panel 110 may be different in an embodiment.

A first output transistor ST7 of the (n−4)-th scan writing stage SW[n−4] may have a first buffer size. The first output transistor ST7 may be a transistor of the pull down part 240.

A first output transistor ST7X of the (n−2)-th scan writing stage SW[n−2] may have a buffer size unequal to the buffer size of the first output transistor ST7 of the (n−4)-th scan writing stage SW[n−4]. The first output transistor ST7X of the (n−2)-th scan writing stage SW[n−2] may have a second buffer size. The second buffer size may be less than the first buffer size.

A first output transistor ST7Y of the n-th scan writing stage SW[n] may have a buffer size unequal to the buffer size of the first output transistor ST7X of the (n−2)-th scan writing stage SW[n−2]. The first output transistor ST7Y of the n-th scan writing stage SW[n] may have a third buffer size. The third buffer size may be less than the second buffer size.

The buffer sizes of the first output transistors of the first to (n−5)-th scan writing stages may be substantially the same as the buffer size of the first output transistor ST7 of the (n−4)-th scan writing stage.

The buffer size of the first output transistor of the (n−3)-th scan writing stage may be substantially the same as the buffer size of the first output transistor ST7X of the (n−2)-th scan writing stage.

The buffer size of the first output transistor of the (n−1)-th scan writing stage may be substantially the same as the buffer size of the first output transistor ST7Y of the n-th scan writing stage.

A second output transistor ST6 of the (n−4)-th scan writing stage SW[n−4] may have a fourth buffer size. The second output transistor ST6 may be a transistor of the pull up part 250.

A second output transistor ST6X of the (n−2)-th scan writing stage SW[n−2] may have a buffer size unequal to the buffer size of the second output transistor ST6 of the (n−4)-th scan writing stage SW[n−4]. The second output transistor ST6X of the (n−2)-th scan writing stage SW[n−2] may have a fifth buffer size. The fifth buffer size may be less than the fourth buffer size.

A second output transistor ST6Y of the n-th scan writing stage SW[n] may have a buffer size unequal to the buffer size of the second output transistor ST6X of the (n−2)-th scan writing stage SW[n−2]. The second output transistor ST6Y of the n-th scan writing stage SW[n] may have a sixth buffer size. The sixth buffer size may be less than the fifth buffer size.

The buffer sizes of the second output transistors of the first to (n−5)-th scan writing stages may be substantially the same as the buffer size of the second output transistor ST6 of the (n−4)-th scan writing stage.

The buffer size of the second output transistor of the (n−3)-th scan writing stage may be substantially the same as the buffer size of the second output transistor ST6X of the (n−2)-th scan writing stage.

The buffer size of the second output transistor of the (n−1)-th scan writing stage may be substantially the same as the buffer size of the second output transistor ST6Y of the n-th scan writing stage.

For example, the buffer size (or buffer value) of the first output transistor and the buffer size (or buffer value) of the second output transistor may be (or may be proportional to or related to) a width-to-length ratio (W/L) of (e.g., the gate electrode or channel of) the first output transistor (which may be a metal-oxide-semiconductor field-effect transistor or MOSFET) and a width-to-length ratio (W/L) of (e.g., the gate electrode or channel of) the second output transistor (which may be another MOSFET). A length of a transistor may be in an extending direction of a geometric line that passes through both the source electrode and drain electrode of the transistor. A width of the transistor may be in a direction perpendicular to the length of the transistor and parallel to a substrate of the transistor.

The waveforms of the scan writing signals of the (n−4)-th stage, the (n−2)-th stage and the n-th stage are shown in FIG. 12C when the buffer sizes of the transistors of the (n−3)-th to n-th scan writing stages are unequal as discussed with reference to FIG. 11.

In FIG. 12C, the buffer sizes of the output transistors ST7, ST7X AND ST7Y of the pull down parts and the buffer sizes of the output transistors ST6, ST6X AND ST6Y of the pull up parts are properly configured, so that the signals GW[n−4], GW[n−2] and GW[n] have similar waveforms to one another. For example, the falling waveforms a1, a1 and a1 of the signals GW[n−4], GW[n−2] and GW[n] may be substantially the same as one another. The rising waveforms a2, a2 and a2 of the signals GW[n−4], GW[n−2] and GW[n] may be substantially the same as one another. When the buffer sizes of the output transistors ST7, ST7X AND ST7Y of the pull down parts are properly configured, the waveforms a1, a1 and a1 of the scan writing signals GW[n−4], GW[n−2] and GW[n] corresponding to the pull down portion may be configured to be substantially the same as one another. In addition, when the buffer sizes of the output transistors ST7, ST7X and ST7Y of the pull down parts and the output transistors ST, ST6X and ST6Y of the pull up parts, which are related to the waveforms of the pulling up of the scan writing signals, are properly configured, the waveforms b1, b1 and b1 of the scan writing signals GW[n−4], GW[n−2] and GW[n] corresponding to the pull up portion may be configured to be substantially identical to one another.

In an embodiment, the structure of the scan writing stages SW[1] to SW[n] is explained in detail. The structure of the scan writing stages SW[1] to SW[n] may be applied to the scan initialization stages SI[1] to SI[n] and the scan bypass stages SB[1] to SB[n].

According to an embodiment, three scan writing pulses may be applied to a single scan writing line during a frame. Thus, the pixel 111 may represent the desired luminance accurately.

In addition, the sizes of the transistors (e.g. ST7) of four stages at the end portion of the display panel 110 may be configured in the 3-CLK driving method so that the display defect which displays a dark image at the end portion of the display panel 110 may be prevented.

Figure 13:
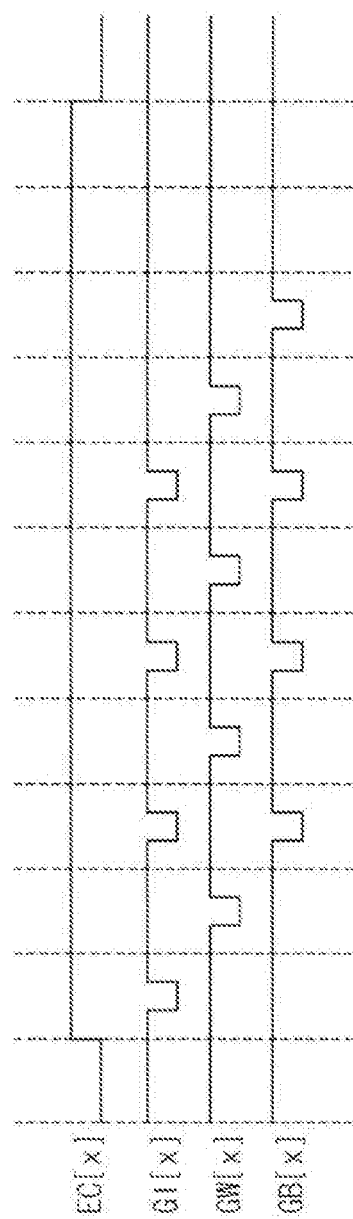
FIG. 13 is a timing diagram illustrating driving signals applied to the pixel in stage x when the scan driver of FIG. 1 is driven in a 4-CLK driving method according to an embodiment.
Figure 14:
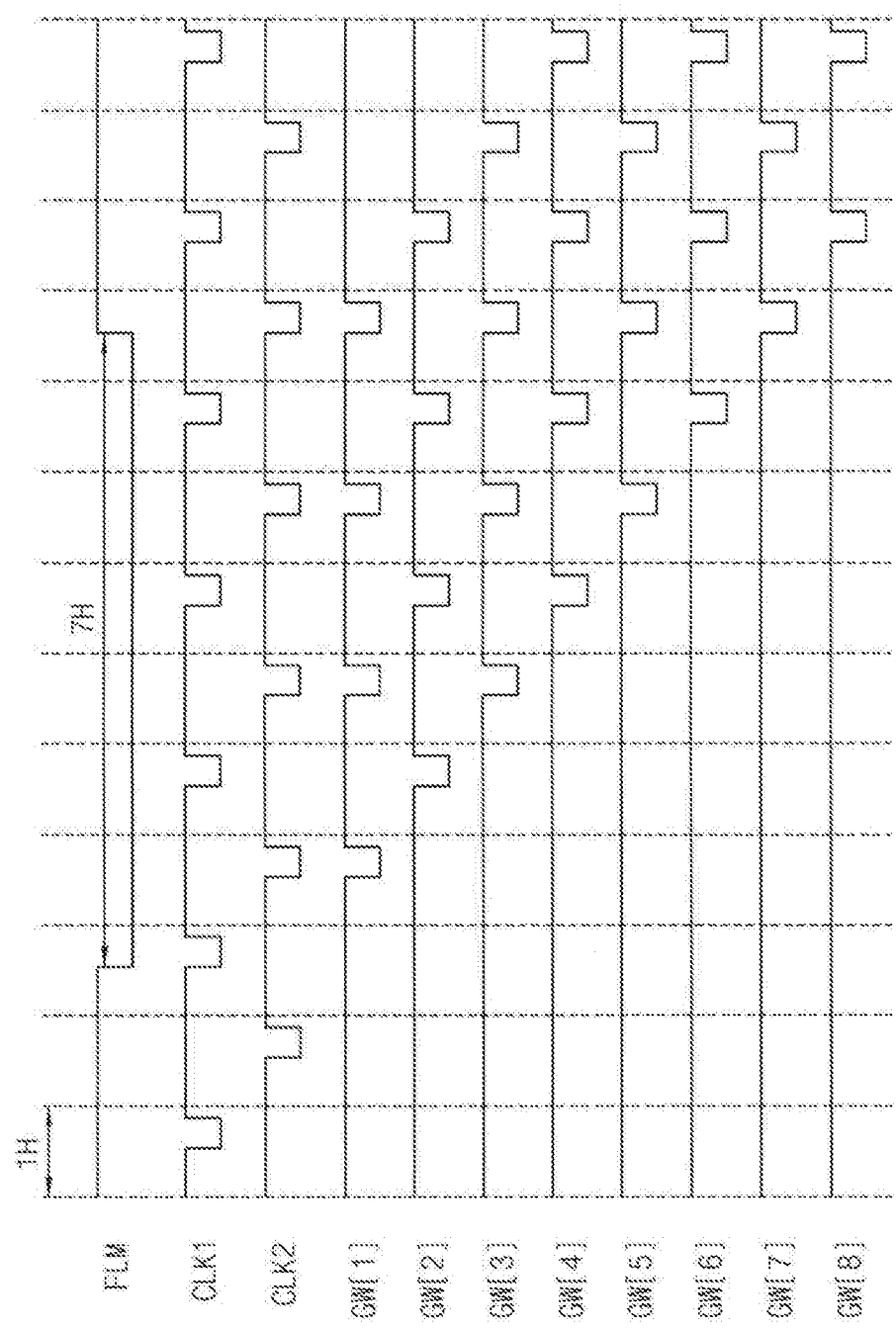
FIG. 14 is a timing diagram illustrating scan writing signals applied to the scan writing stages when the scan driver of FIG. 1 is driven in the 4-CLK driving method according to an embodiment.
Figure 15:
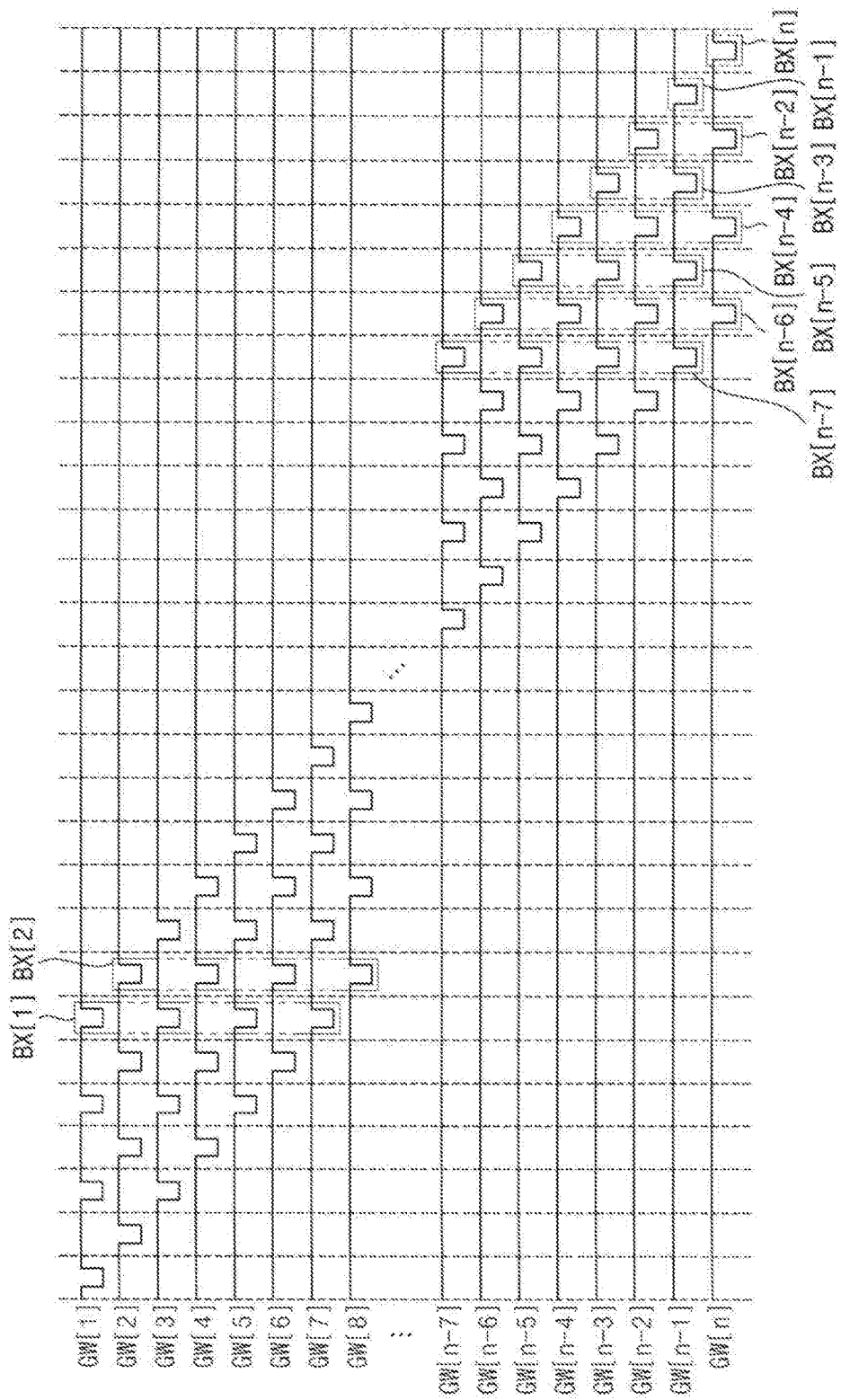
FIG. 15 is a timing diagram illustrating scan writing signals applied to all of the scan writing stages when the scan driver of FIG. 1 is driven in the 4-CLK driving method according to an embodiment.
Figure 16:
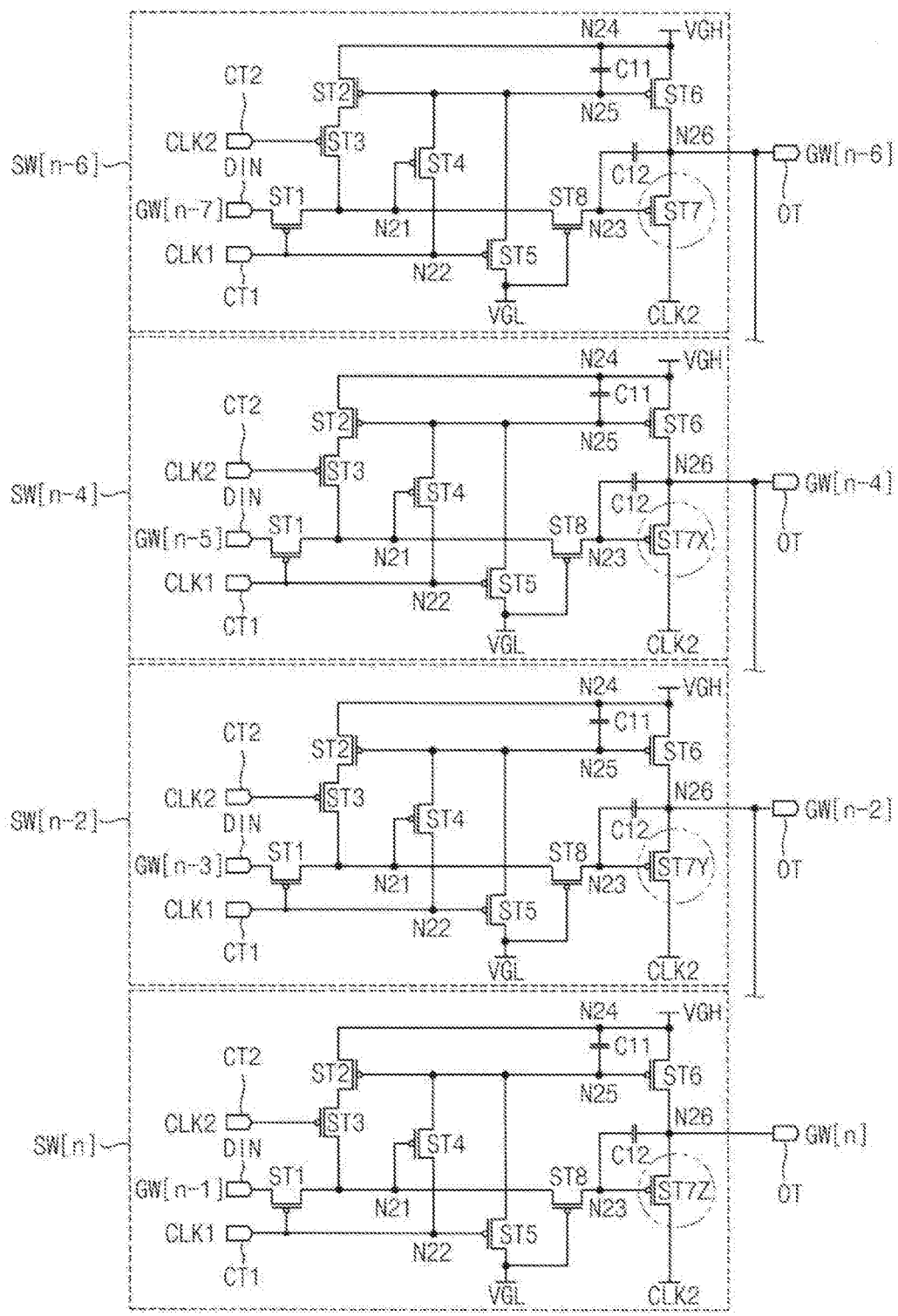
FIG. 16 is a circuit diagram illustrating (n−6)-th, (n−4)-th, (n−2)-th and n-th scan writing stages of a scan driver according to an embodiment.
Figure 17:
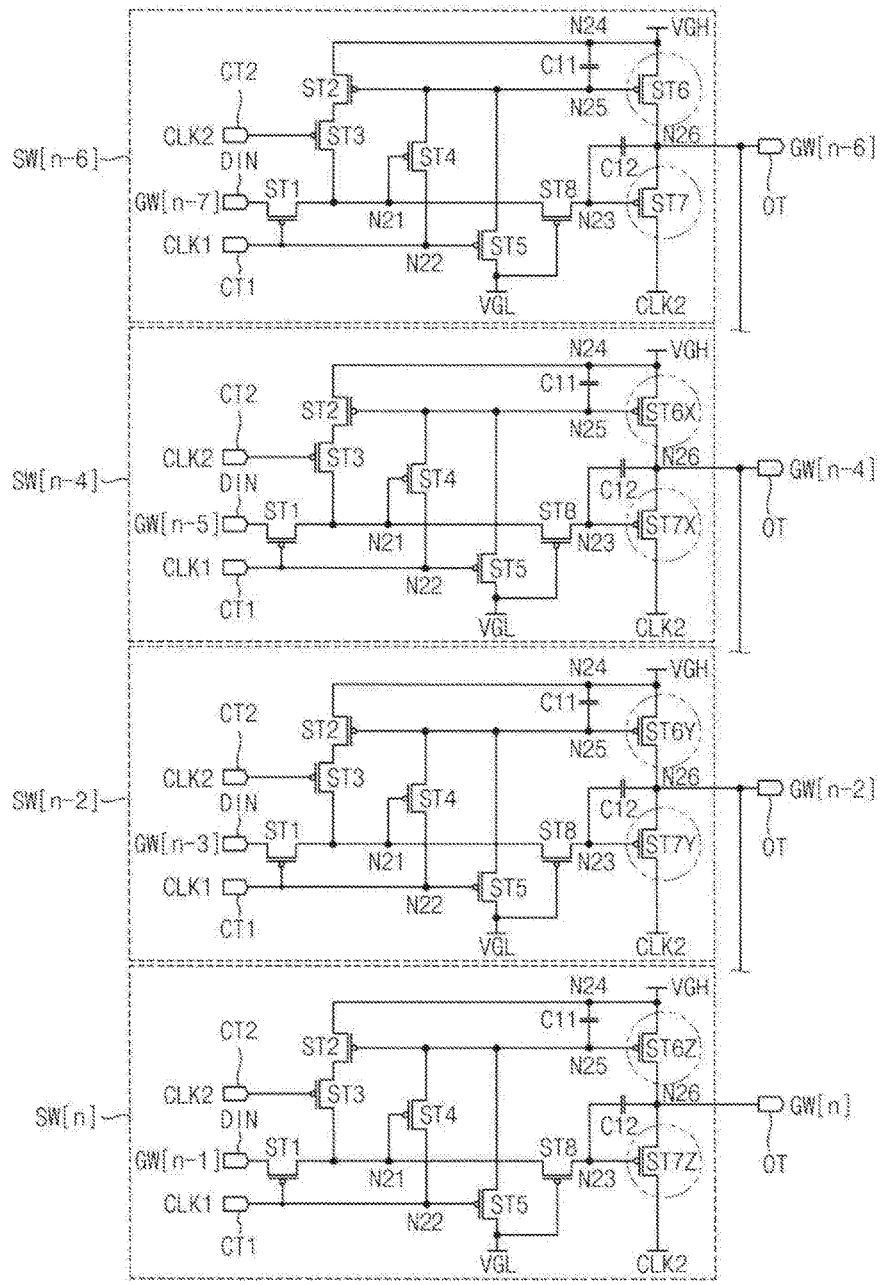
FIG. 17 is a circuit diagram illustrating (n−6)-th, (n−4)-th, (n−2)-th and n-th scan writing stages of a scan driver according to an embodiment.

FIG. 13 is a timing diagram illustrating driving signals applied to the pixel in stage x when the scan driver of FIG. 1 is driven in a 4-CLK driving method. FIG. 14 is a timing diagram illustrating scan writing signals applied to the scan writing stages when the scan driver of FIG. 1 is driven in the 4-CLK driving method. FIG. 15 is a timing diagram illustrating scan writing signals applied to all of the scan writing stages when the scan driver of FIG. 1 is driven in the 4-CLK driving method. FIG. 16 is a circuit diagram illustrating (n−6)-th, (n−4)-th, (n−2)-th and n-th scan writing stages of a scan driver according to an embodiment. FIG. 17 is a circuit diagram illustrating (n−6)-th, (n−4)-th, (n−2)-th and n-th scan writing stages of a scan driver according to an embodiment.

The scan driver and the display apparatus of according to an embodiment may be substantially analogous to or identical to the scan driver and the display apparatus of the previous embodiment explained referring to FIGS. 1 to 12C except for the method of driving the scan driver and the structure of the end portion of the scan driver. Thus, the same reference numerals will be used to refer to the same or like parts as those described in the previous embodiment of FIGS. 1 to 12C and any repetitive explanation concerning the above elements will be omitted.

Referring to FIGS. 1 to 5 and 13 to 17, the display apparatus 100 may include a driving circuit 105, a display panel 110 and a power supply 180. For example, the display apparatus 100 may be an OLED display apparatus.

The driving circuit 105 may include a timing controller 130, a data driver 150, a scan driver 200, and an emission driver 170.

The scan driver 200 includes a plurality of stages S1 to Sn.

The stages S1 to Sn of the scan driver 200 provide scan signals to the pixels respectively connected to the stages S1 to Sn.

The stages S1 to Sn may respectively include scan writing stages SW[1] to SW[n] outputting the scan writing signals, scan initialization stages SI[1] to SI[n] outputting the scan initialization signals and scan bypass stages SB[1] to SB[n] outputting the scan bypass signals.

In an embodiment, the 4-CLK driving method is explained. In the 4-CLK driving method, four scan writing pulses are outputted to a single scan writing line during a frame. The scan writing signal, the scan initial signal and the scan bypass signal may be applied to the pixel 111 of FIG. 2.

Thus, in the 4-CLK driving method, a scan writing signal GW[x] outputted to a first scan line of an x-th stage has four scan writing pulses during a frame. Similarly, in the 4-CLK driving method, a scan initialization signal GI[x] outputted to a second scan line of the x-th stage has four scan initialization pulses during a frame. Similarly, in the 4-CLK driving method, a scan bypass signal GB[x] outputted to a third scan line of the x-th stage has four scan initialization pulses during a frame.

According to the explained above, four scan pulses are applied to the single scan writing line during a frame so that the pixel 111 may represent the desired luminance accurately compared to the normal driving method.

Referring to FIG. 14, in the 4-CLK driving method, the scan writing stage outputs four scan writing pulses during a frame. The start signal FLM applied to the first scan writing stage has a low level duration longer than a low level duration of the start signal FLM in the normal driving method to operate the 4-CLK driving method. For example, the start signal FLM applied to the first scan writing stage may have the low level duration of seven horizontal cycles 7H to operate the 4-CLK driving method.

In the normal driving method, a single clock pulse corresponds to a single scan writing pulse of a single writing scan writing line. However, in the 4-CLK driving method, a single clock pulse corresponds to four scan writing pulses of four scan writing lines. As shown in a tenth horizontal cycle of FIG. 14, first, third, fifth and seventh scan writing signals generate scan writing pulses corresponding to the low level of the second clock signal CLK2.

Referring to FIG. 15, for example, the scan driver may include n stages. The n-th stage may mean the last stage. The display panel 110 may include n pixel rows corresponding to the n stages.

In the 4-CLK driving method, the scan writing signal applied to the scan writing line has four scan writing pulses. When the fourth scan writing pulse among the four scan writing pulses is applied to the pixel 111 may mean a data writing time.

As shown in a first box BX[1], when the fourth scan writing pulse of the first scan writing signal GW[1] is applied to the pixel 111, four scan writing pulses of GW[1], GW[3], GW[5] and GW[7] may be simultaneously generated based on a single clock pulse.

Similarly, as shown in an (n−6)-th box BX[n−6], when the fourth scan writing pulse of the (n−6)-th scan writing signal GW[n−6] is applied to the pixel 111, four scan writing pulses of GW[n−6], GW[n−4], GW[n−2] and GW[n] may be simultaneously generated based on a single clock pulse.

However, as shown in an (n−4)-th box BX[n−4], when the fourth scan writing pulse of the (n−4)-th scan writing signal GW[n−4] is applied to the pixel 111, three scan writing pulses of GW[n−4], GW[n−2] and GW[n] may be simultaneously generated based on a single clock pulse.

In addition, as shown in an (n−2)-th box BX[n−2], when the fourth scan writing pulse of the (n−2)-th scan writing signal GW[n−2] is applied to the pixel 111, two scan writing pulses of GW[n−2] and GW[n] may be simultaneously generated based on a single clock pulse.

In addition, as shown in an n-th box BX[n], when the fourth scan writing pulse of the n-th scan writing signal GW[n] is applied to the pixel 111, the scan writing pulse of GW[n] may be generated based on a single clock pulse.

In an embodiment, when the fourth pulse of each scan writing signal is applied, four scan writing pulses are simultaneously generated in the first to (n−6)-th scan writing signals. When the fourth pulse of each scan writing signal is applied, three scan writing pulses are simultaneously generated in the (n−5)-th and (n−4)-th scan writing signals. When the fourth pulse of each scan writing signal is applied, two scan writing pulses are simultaneously generated in the (n−3)-th and (n−2)-th scan writing signals. When the fourth pulse of each scan writing signal is applied, a single scan writing pulse is generated in the (n−1)-th and n-th scan writing signals.

Referring to FIG. 16, sizes of the transistors ST7 of the pull down parts 240 of six stages at the end portion of the display panel 110 may be configured in the 4-CLK driving method.

A first output transistor ST7 of the (n−6)-th scan writing stage SW[n−6] may have a first buffer size. The first output transistor ST7 may be a transistor of the pull down part 240.

A first output transistor ST7X of the (n−4)-th scan writing stage SW[n−4] may have a buffer size unequal to the buffer size of the first output transistor ST7 of the (n−6)-th scan writing stage SW[n−6]. The first output transistor ST7X of the (n−4)-th scan writing stage SW[n−4] may have a second buffer size. The second buffer size may be less than the first buffer size.

A first output transistor ST7Y of the (n−2)-th scan writing stage SW[n−2] may have a buffer size unequal to the buffer size of the first output transistor ST7X of the (n−4)-th scan writing stage SW[n−4]. The first output transistor ST7Y of the (n−2)-th scan writing stage SW[n−2] may have a third buffer size. The third buffer size may be less than the second buffer size.

A first output transistor ST7Z of the n-th scan writing stage SW[n] may have a buffer size unequal to the buffer size of the first output transistor ST7Y of the (n−2)-th scan writing stage SW[n−2]. The first output transistor ST7Z of the n-th scan writing stage SW[n] may have a fourth buffer size. The fourth buffer size may be less than the third buffer size.

The buffer sizes of the first output transistors of the first to (n−7)-th scan writing stages may be substantially the same as the buffer size of the first output transistor ST7 of the (n−6)-th scan writing stage.

The buffer size of the first output transistor of the (n−5)-th scan writing stage may be substantially the same as the buffer size of the first output transistor ST7X of the (n−4)-th scan writing stage.

The buffer size of the first output transistor of the (n−3)-th scan writing stage may be substantially the same as the buffer size of the first output transistor ST7Y of the (n−2)-th scan writing stage.

The buffer size of the first output transistor of the (n−1)-th scan writing stage may be substantially the same as the buffer size of the first output transistor ST7Z of the n-th scan writing stage.

Referring to FIG. 17, sizes of the transistors ST7 of the pull down parts 240 and sizes of the transistors ST6 of the pull up parts 250 of six stages at the end portion of the display panel 110 may be configured in the 4-CLK driving method.

In an embodiment, the method of adjusting the size of the transistor ST7 of the pull down part 240 is substantially the same as the method explained in FIG. 16.

A second output transistor ST6 of the (n−6)-th scan writing stage SW[n−6] may have a fifth buffer size. The second output transistor ST6 may be a transistor of the pull up part 250.

A second output transistor ST6X of the (n−4)-th scan writing stage SW[n−4] may have a buffer size unequal to the buffer size of the second output transistor ST6 of the (n−6)-th scan writing stage SW[n−6]. The second output transistor ST6X of the (n−4)-th scan writing stage SW[n−4] may have a sixth buffer size. The sixth buffer size may be less than the fifth buffer size.

A second output transistor ST6Y of the (n−2)-th scan writing stage SW[n−2] may have a buffer size unequal to the buffer size of the second output transistor ST6X of the (n−4)-th scan writing stage SW[n−4]. The second output transistor ST6Y of the (n−2)-th scan writing stage SW[n−2] may have a seventh buffer size. The seventh buffer size may be less than the sixth buffer size.

A second output transistor ST6Z of the n-th scan writing stage SW[n] may have a buffer size unequal to the buffer size of the second output transistor ST6Y of the (n−2)-th scan writing stage SW[n−2]. The second output transistor ST6Z of the n-th scan writing stage SW[n] may have an eighth buffer size. The eighth buffer size may be less than the seventh buffer size.

In the previous embodiment, the 3-CLK driving method in which three scan writing pulses are applied to the single scan writing line during a frame is explained. In an embodiment, the 4-CLK driving method in which four scan writing pulses are applied to the single scan writing line during a frame is explained. Alternatively, the present inventive concept may be applied to 5-CLK driving method or more in which five or more scan writing pulses are applied to the single scan writing line during a frame based on the above explanation.

According to an embodiment, four scan writing pulses may be applied to a single scan writing line during a frame. Thus, the pixel 111 may represent the desired luminance accurately.

In addition, the sizes of the transistors (e.g. ST7) of six stages at the end portion of the display panel 110 may be configured in the 4-CLK driving method so that the display defect which displays a dark image at the end portion of the display panel 110 may be prevented.

Figure 18:
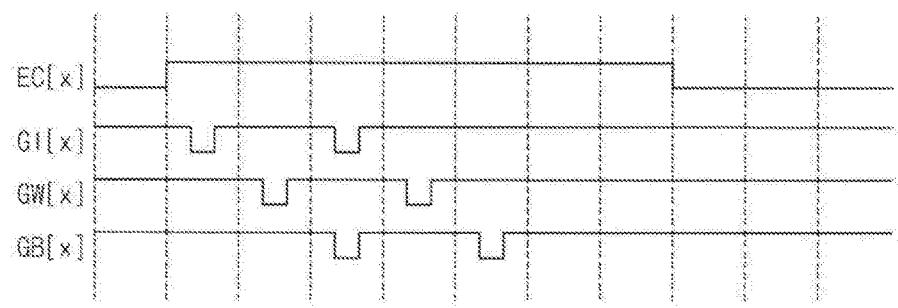
FIG. 18 is a timing diagram illustrating driving signals applied to the pixel in stage x when the scan driver of FIG. 1 is driven in a 2-CLK driving method according to an embodiment.
Figure 19:
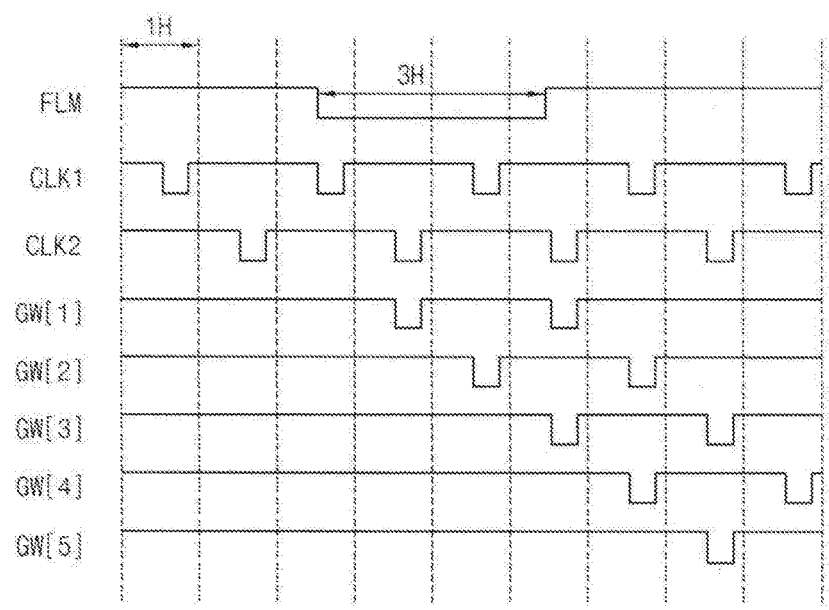
FIG. 19 is a timing diagram illustrating scan writing signals applied to the scan writing stages when the scan driver of FIG. 1 is driven in the 2-CLK driving method according to an embodiment.
Figure 20:
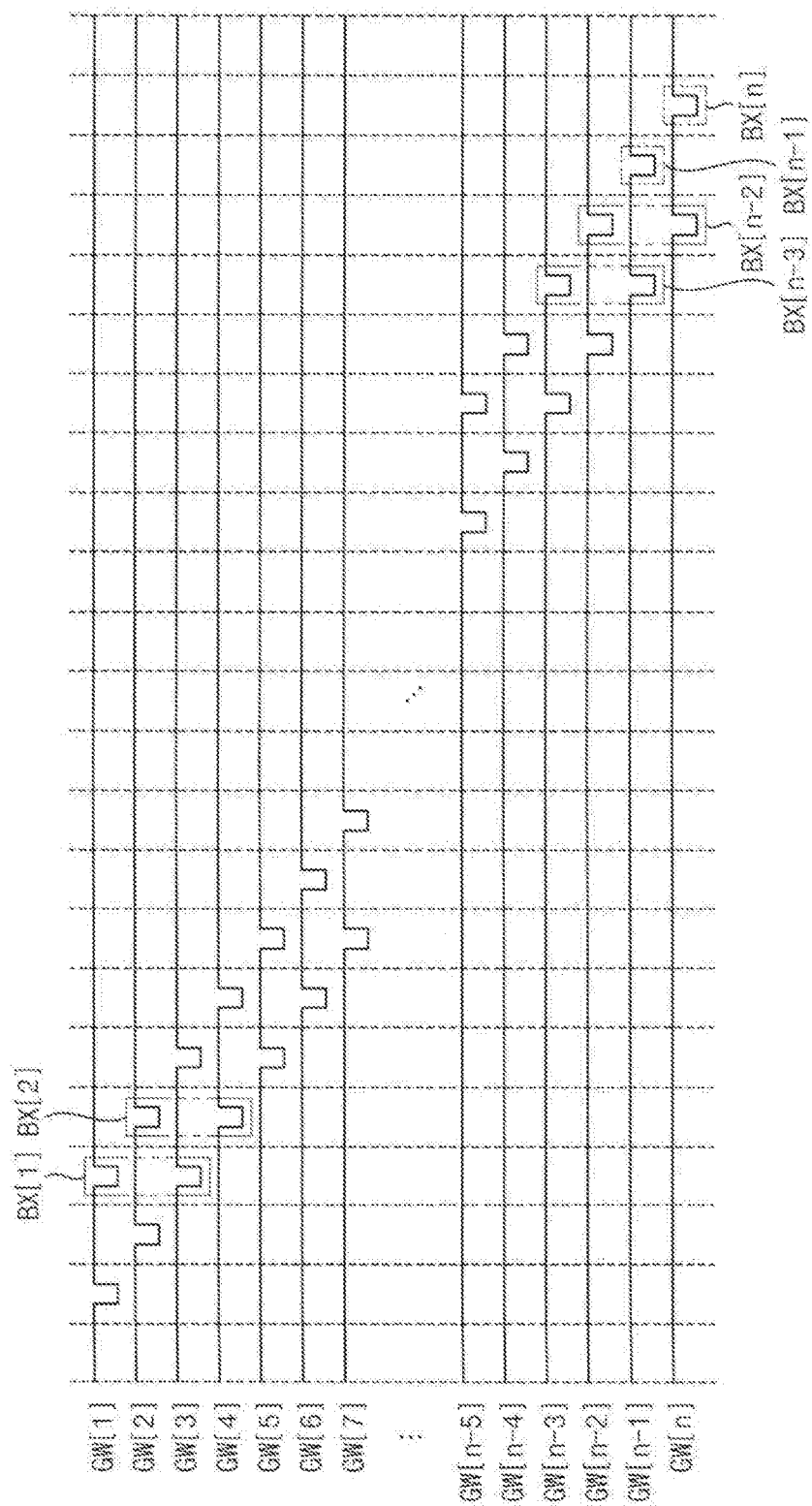
FIG. 20 is a timing diagram illustrating scan writing signals applied to all of the scan writing stages when the scan driver of FIG. 1 is driven in the 2-CLK driving method according to an embodiment.
Figure 21:
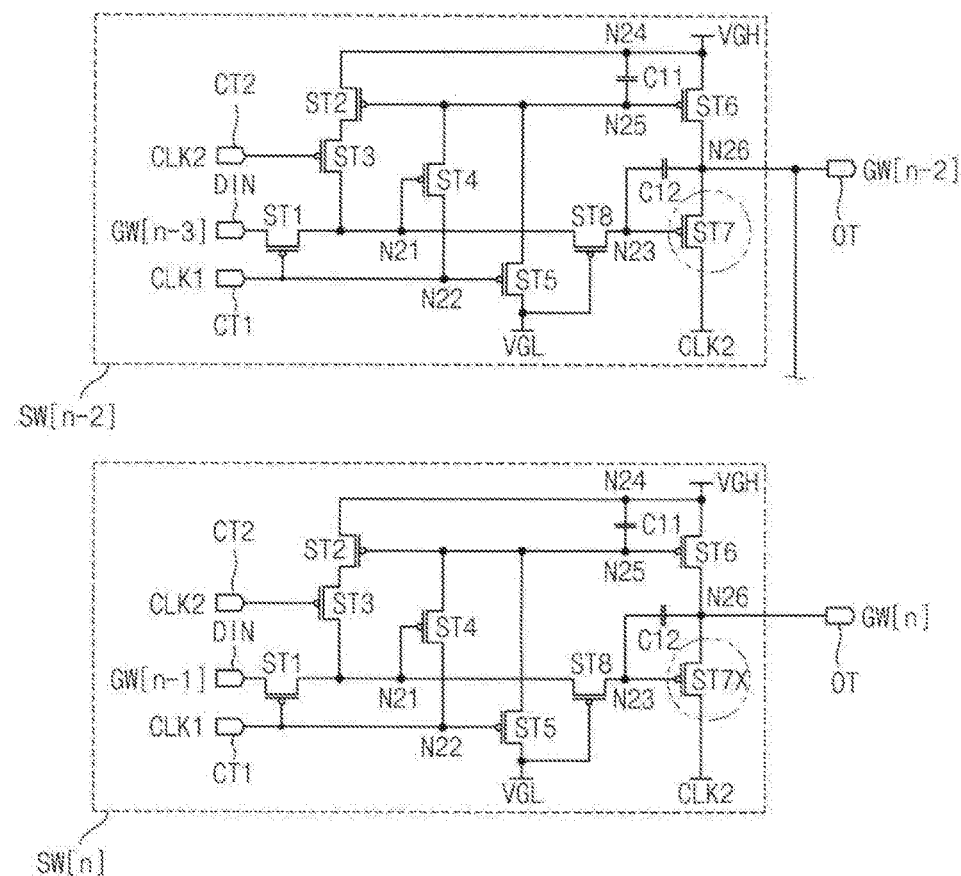
FIG. 21 is a circuit diagram illustrating (n−2)-th and n-th scan writing stages of a scan driver according to an embodiment.
Figure 22:
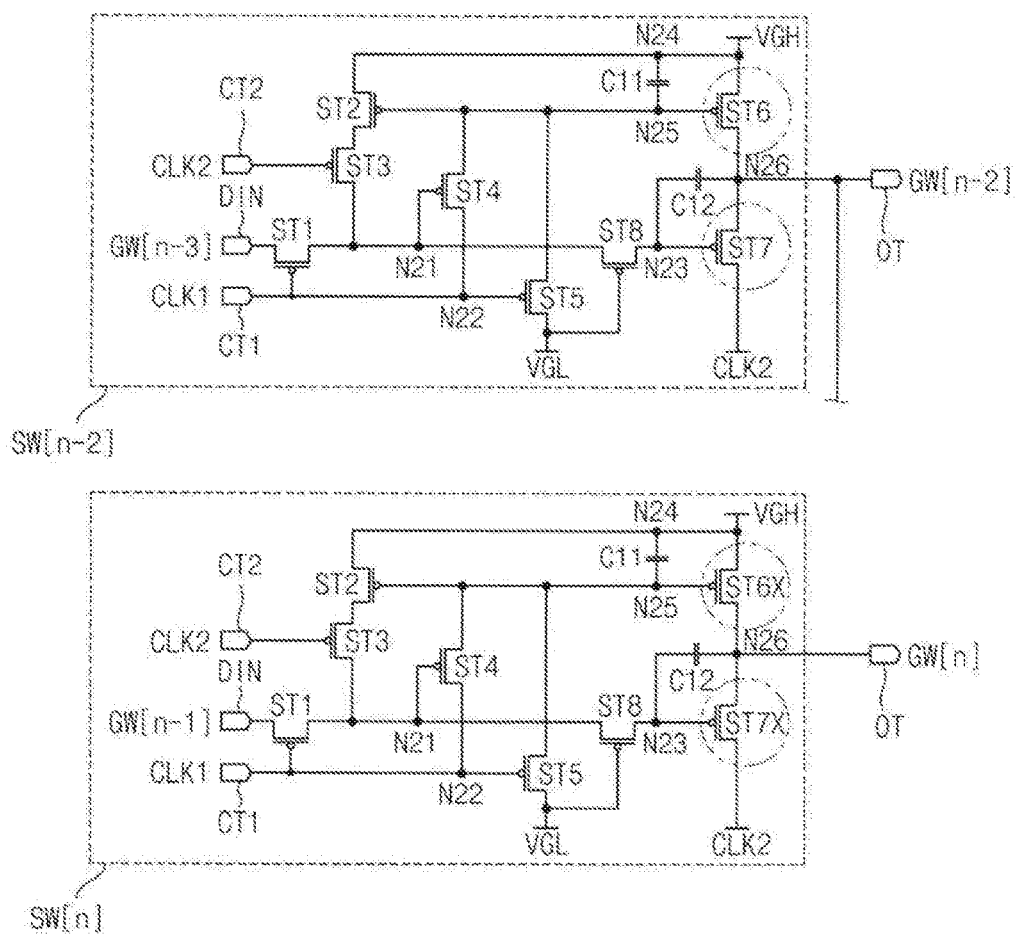
FIG. 22 is a circuit diagram illustrating (n−2)-th and n-th scan writing stages of a scan driver according to an embodiment.

FIG. 18 is a timing diagram illustrating driving signals applied to the pixel in stage x when the scan driver of FIG. 1 is driven in a 2-CLK driving method. FIG. 19 is a timing diagram illustrating scan writing signals applied to the scan writing stages when the scan driver of FIG. 1 is driven in the 2-CLK driving method. FIG. 20 is a timing diagram illustrating scan writing signals applied to all of the scan writing stages when the scan driver of FIG. 1 is driven in the 2-CLK driving method. FIG. 21 is a circuit diagram illustrating (n−2)-th and n-th scan writing stages of a scan driver according to an embodiment. FIG. 22 is a circuit diagram illustrating (n−2)-th and n-th scan writing stages of a scan driver according to an embodiment.

The scan driver and the display apparatus of according to an embodiment may be substantially analogous to or identical to the scan driver and the display apparatus of the previous embodiment explained referring to FIGS. 1 to 12C except for the method of driving the scan driver and the structure of the end portion of the scan driver. Thus, the same reference numerals will be used to refer to the same or like parts as those described in the previous embodiment of FIGS. 1 to 12C and any repetitive explanation concerning the above elements will be omitted.

Referring to FIGS. 1 to 5 and 18 to 22, the display apparatus 100 may include a driving circuit 105, a display panel 110 and a power supply 180. For example, the display apparatus 100 may be an OLED display apparatus.

The driving circuit 105 may include a timing controller 130, a data driver 150, a scan driver 200, and an emission driver 170.

The scan driver 200 includes a plurality of stages S1 to Sn.

The stages S1 to Sn of the scan driver 200 provide scan signals to the pixels respectively connected to the stages S1 to Sn.

The stages S1 to Sn may respectively include scan writing stages SW[1] to SW[n] outputting the scan writing signals, scan initialization stages SI[1] to SI[n] outputting the scan initialization signals and scan bypass stages SB[1] to SB[n] outputting the scan bypass signals.

In an embodiment, the 2-CLK driving method is explained. In the 2-CLK driving method, two scan writing pulses are outputted to a single scan writing line during a frame. The scan writing signal, the scan initial signal and the scan bypass signal may be applied to the pixel 111 of FIG. 2.

Thus, in the 2-CLK driving method, a scan writing signal GW[x] outputted to a first scan line of an x-th stage has two scan writing pulses during a frame. Similarly, in the 2-CLK driving method, a scan initialization signal GI[x] outputted to a second scan line of the x-th stage has two scan initialization pulses during a frame. Similarly, in the 2-CLK driving method, a scan bypass signal GB[x] outputted to a third scan line of the x-th stage has two scan initialization pulses during a frame.

According to the explained above, two scan pulses are applied to the single scan writing line during a frame so that the pixel 111 may represent the desired luminance accurately compared to the normal driving method.

Referring to FIG. 19, in the 2-CLK driving method, the scan writing stage outputs two scan writing pulses during a frame. The start signal FLM applied to the first scan writing stage has a low level duration longer than a low level duration of the start signal FLM in the normal driving method to operate the 2-CLK driving method. For example, the start signal FLM applied to the first scan writing stage may have the low level duration of three horizontal cycles 3H to operate the 2-CLK driving method.

In the normal driving method, a single clock pulse corresponds to a single scan writing pulse of a single scan writing line. However, in the 2-CLK driving method, a single clock pulse corresponds to two scan writing pulses of two scan writing lines. As shown in a sixth horizontal cycle of FIG. 19, first and third scan writing signals generate scan writing pulses corresponding to the low level of the second clock signal CLK2.

Referring to FIG. 20, for example, the scan driver may include n stages. The n-th stage may mean the last stage. The display panel 110 may include n pixel rows corresponding to the n stages.

In the 2-CLK driving method, the scan writing signal applied to the scan writing line has two scan writing pulses. When the second scan writing pulse among the two scan writing pulses is applied to the pixel 111 may mean a data writing time.

As shown in a first box BX[1], when the second scan writing pulse of the first scan writing signal GW[1] is applied to the pixel 111, two scan writing pulses of GW[1] and GW[3] may be simultaneously generated based on a single clock pulse.

Similarly, as shown in an (n−2)-th box BX[n−2], when the second scan writing pulse of the (n−2)-th scan writing signal GW[n−2] is applied to the pixel 111, two scan writing pulses of GW[n−2], GW[n−4], GW[n−2] and GW[n] may be simultaneously generated based on a single clock pulse.

However, as shown in an n-th box BX[n], when the second scan writing pulse of the n-th scan writing signal GW[n] is applied to the pixel 111, the scan writing pulse of GW[n] may be generated based on a single clock pulse.

In an embodiment, when the second pulse of each scan writing signal is applied, two scan writing pulses are simultaneously generated in the first to (n−2)-th scan writing signals. When the second pulse of each scan writing signal is applied, a single scan writing pulse is generated in the (n−1)-th and n-th scan writing signals.

Referring to FIG. 21, sizes of the transistors ST7 of the pull down parts 240 of two stages at the end portion of the display panel 110 may be configured in the 2-CLK driving method.

A first output transistor ST7 of the (n−2)-th scan writing stage SW[n−2] may have a first buffer size. The first output transistor ST7 may be a transistor of the pull down part 240.

A first output transistor ST7X of the n-th scan writing stage SW[n] may have a buffer size unequal to the buffer size of the first output transistor ST7 of the (n−2)-th scan writing stage SW[n−2]. The first output transistor ST7X of the n-th scan writing stage SW[n] may have a second buffer size. The second buffer size may be less than the first buffer size.

The buffer sizes of the first output transistors of the first to (n−3)-th scan writing stages may be substantially the same as the buffer size of the first output transistor ST7 of the (n−2)-th scan writing stage.

The buffer size of the first output transistor of the (n−1)-th scan writing stage may be substantially the same as the buffer size of the first output transistor ST7X of the n-th scan writing stage.

Referring to FIG. 22, sizes of the transistors ST7 of the pull down parts 240 and sizes of the transistors ST6 of the pull up parts 250 of two stages at the end portion of the display panel 110 may be configured in the 2-CLK driving method.

In an embodiment, the method of adjusting the size of the transistor ST7 of the pull down part 240 is substantially the same as the method explained in FIG. 21.

A second output transistor ST6 of the (n−2)-th scan writing stage SW[n−2] may have a third buffer size. The second output transistor ST6 may be a transistor of the pull up part 250.

A second output transistor ST6X of the n-th scan writing stage SW[n] may have a buffer size unequal to the buffer size of the second output transistor ST6 of the (n−2)-th scan writing stage SW[n−2]. The second output transistor ST6X of the n-th scan writing stage SW[n] may have a fourth buffer size. The fourth buffer size may be less than the third buffer size.

According to an embodiment, two scan writing pulses may be applied to a single scan writing line during a frame. Thus, the pixel 111 may represent the desired luminance accurately.

In addition, the sizes of the transistors (e.g. ST7) of two stages at the end portion of the display panel 110 may be configured in the 2-CLK driving method so that the display defect which displays a dark image at the end portion of the display panel 110 may be prevented.

Figure 23:
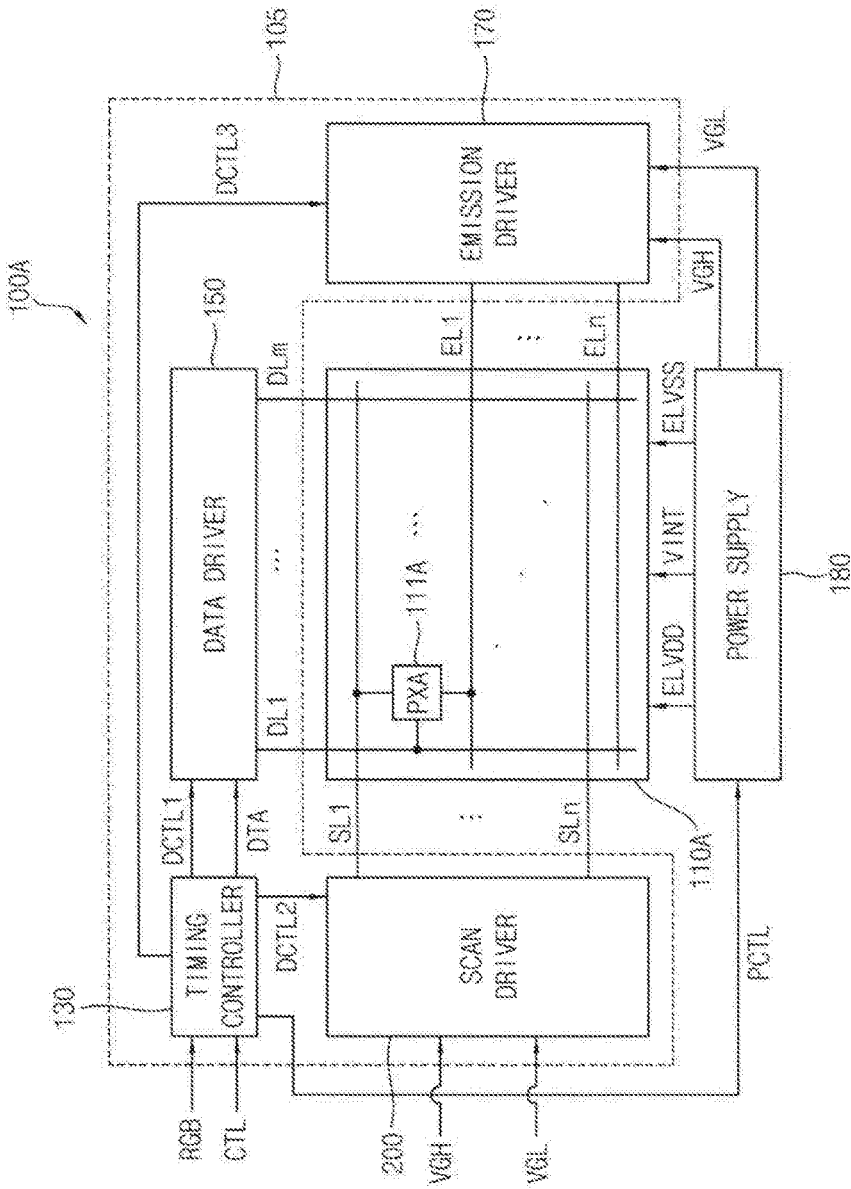
FIG. 23 is a block diagram illustrating a display apparatus according to an embodiment.
Figure 24:
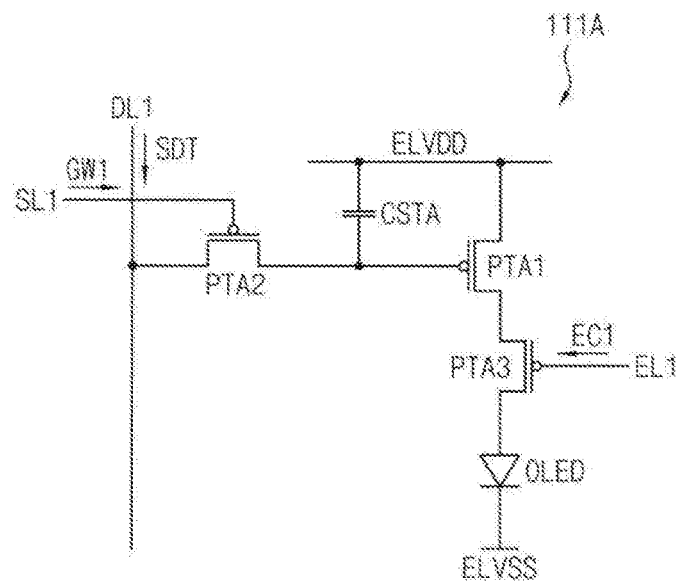
FIG. 24 is a circuit diagram illustrating a pixel of FIG. 23 according to an embodiment.
Figure 25:
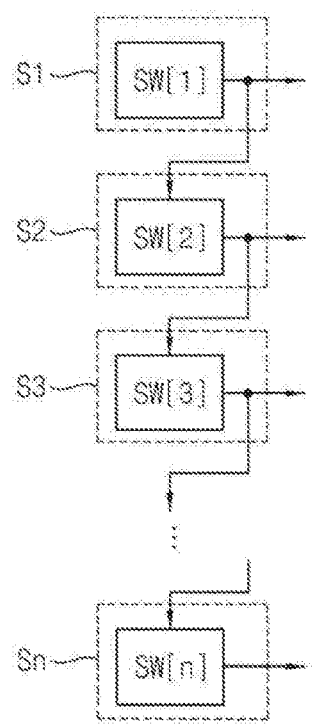
FIG. 25 is a block diagram illustrating a scan driver of FIG. 23 according to an embodiment.
Figure 26:
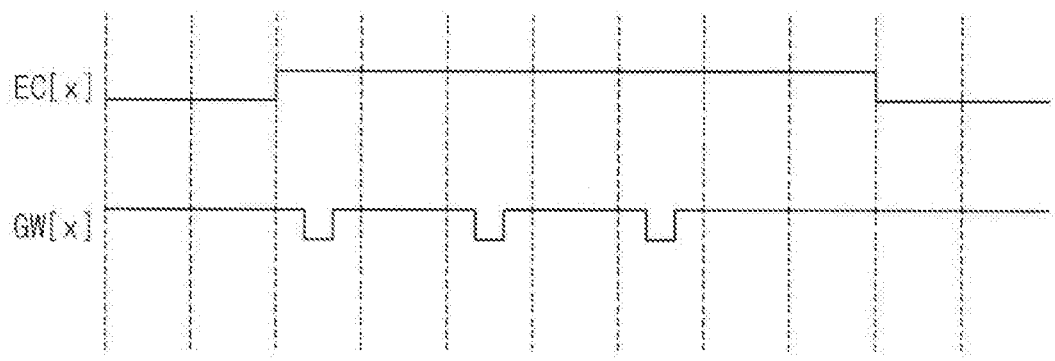
FIG. 26 is a timing diagram illustrating driving signals applied to the pixel in stage x when the scan driver of FIG. 23 is driven in a 3-CLK driving method according to an embodiment.

FIG. 23 is a block diagram illustrating a display apparatus according to an embodiment. FIG. 24 is a circuit diagram illustrating a pixel of FIG. 23. FIG. 25 is a block diagram illustrating a scan driver of FIG. 23. FIG. 26 is a timing diagram illustrating driving signals applied to the pixel in stage x when the scan driver of FIG. 23 is driven in a 3-CLK driving method.

The scan driver and the display apparatus of according to an embodiment may be substantially analogous to or identical to the scan driver and the display apparatus of the previous embodiment explained referring to FIGS. 1 to 12C except for the structure of the pixels and the structure of the scan driver. Thus, the same reference numerals will be used to refer to the same or like parts as those described in the previous embodiment of FIGS. 1 to 12C and any repetitive explanation concerning the above elements will be omitted.

Referring to FIGS. 23 to 26, the display apparatus 100A may include a driving circuit 105, a display panel 110A and a power supply 180. For example, the display apparatus 100A may be an OLED display apparatus.

The driving circuit 105 may include a timing controller 130, a data driver 150, a scan driver 200, and an emission driver 170.

The display panel 110A may be connected to the scan driver 200 through a plurality of scan lines SL1 to SLn (n is an integer greater than three). The display panel 110A may be connected to the data driver 150 through a plurality of data lines DL1 to DLm (m is an integer greater than three). The display panel 110A may be connected to the emission driver 170 of the driving circuit 220 through a plurality of emission control lines EL1 to ELn. The display panel 110A may include a plurality of pixels 111A, and each pixel 111A is disposed at an intersection of each of scan lines SL1 to SLn, each of the data lines DL1 to DLm and each of the emission control lines EL1 to ELn.

Referring to FIG. 24, the structure of the pixel 111A connected to a first data line DL1, a scan line SL1 and an emission control line EL1 is explained.

The pixel 111A may include an OLED, a driving transistor PTA1, a capacitor CSTA, a switching transistor PTA2 and an emission control transistor PTA3.

The driving transistor PTA1 may includes a gate electrode connected to a drain electrode of the switching transistor PTA2, a source electrode to which the high power supply voltage ELVDD is applied and a drain electrode connected to a source electrode of the emission control transistor PTA3.

The switching transistor PTA2 may include a gate electrode connected to the scan line SL1, a source electrode connected to the data line DL1 and the drain electrode connected to the gate electrode of the driving transistor PTA1. The switching transistor PTA2 may be turned on in response to the scan signal received through the scan line SL1. When the switching transistor PTA2 is turned on, the data signal received through the data line DL1 may be provided to the gate electrode of the driving transistor PTA1.

The capacitor CSTA may include a first end portion connected to the source electrode of the driving transistor PTA1 and a second end portion connected to the gate electrode of the driving transistor PTA1. The capacitor CSTA charges the data signal applied to the gate electrode of the driving transistor PTA1, and maintains the data signal after the switching transistor PTA2 is turned off.

The emission control transistor PTA3 may include a gate electrode connected to the emission control line EL1, a source electrode connected to the drain electrode of the driving transistor PTA1 and a drain electrode connected to an anode electrode of the OLED. The emission control transistor PTA3 may be turned on in response to the emission control signal EC1 received through the emission control line EL1. When the emission control transistor PTA3 is turned on, a driving current passing through the driving transistor may be provided to the OLED.

The low power supply voltage ELVSS is applied to a cathode electrode of the OLED. The OLED emits light based on an intensity of the driving current provided from the driving transistor PTA1 through the emission control transistor PTA3.

Referring to FIG. 25, the scan driver 200 includes a plurality of stages S1 to Sn.

The stages S1 to Sn of the scan driver 200 provide scan signals to the pixels respectively connected to the stages S1 to Sn. For example, the stages S1 to Sn of the scan driver 200 may provide the scan writing signals GW to the pixels respectively connected to the stages S1 to Sn.

The stages S1 to Sn may respectively include scan writing stages SW[1] to SW[n] outputting the scan writing signals.

In FIG. 26, the 3-CLK driving method is explained. In the 3-CLK driving method, three scan writing pulses are outputted to a single scan line during a frame. In the 3-CLK driving method, a scan writing signal GW[x] outputted to a first scan line of an x-th stage has three scan writing pulses during a frame.

According to the explained above, three scan pulses are applied to the single scan writing line during a frame so that the pixel 111A may represent the desired luminance accurately compared to the normal driving method.

In an embodiment, the sizes of the transistors ST7 of the pull down parts 240 of four stages at the end portion of the display panel 110A may be configured in the 3-CLK driving method as shown in FIG. 10.

A first output transistor ST7 of the (n−4)-th scan writing stage SW[n−4] may have a first buffer size. The first output transistor ST7 may be a transistor of the pull down part 240.

A first output transistor ST7X of the (n−2)-th scan writing stage SW[n−2] may have a buffer size unequal to the buffer size of the first output transistor ST7 of the (n−4)-th scan writing stage SW[n−4]. The first output transistor ST7X of the (n−2)-th scan writing stage SW[n−2] may have a second buffer size. The second buffer size may be less than the first buffer size.

A first output transistor ST7Y of the n-th scan writing stage SW[n] may have a buffer size unequal to the buffer size of the first output transistor ST7X of the (n−2)-th scan writing stage SW[n−2]. The first output transistor ST7Y of the n-th scan writing stage SW[n] may have a third buffer size. The third buffer size may be less than the second buffer size.

In an embodiment, sizes of the transistors ST7 of the pull down parts 240 and sizes of the transistors ST6 of the pull up parts 250 of four stages at the end portion of the display panel 110A may be configured in the 3-CLK driving method as shown in FIG. 11.

A second output transistor ST6 of the (n−4)-th scan writing stage SW[n−4] may have a fourth buffer size. The second output transistor ST6 may be a transistor of the pull up part 250.

A second output transistor ST6X of the (n−2)-th scan writing stage SW[n−2] may have a buffer size unequal to the buffer size of the second output transistor ST6 of the (n−4)-th scan writing stage SW[n−4]. The second output transistor ST6X of the (n−2)-th scan writing stage SW[n−2] may have a fifth buffer size. The fifth buffer size may be less than the fourth buffer size.

A second output transistor ST6Y of the n-th scan writing stage SW[n] may have a buffer size unequal to the buffer size of the second output transistor ST6X of the (n−2)-th scan writing stage SW[n−2]. The second output transistor ST6Y of the n-th scan writing stage SW[n] may have a sixth buffer size. The sixth buffer size may be less than the fifth buffer size.

Although the 3-CLK driving method is applied to the display apparatus of FIG. 23 in an embodiment, embodiments are not limited thereto. The sizes of the transistors ST7 of the pull down parts 240 of six stages at the end portion of the display panel 110A may be configured in the 4-CLK driving method as shown in FIG. 16. The sizes of the transistors ST7 of the pull down parts 240 and the sizes of the transistors ST6 of the pull up part 250 of six stages at the end portion of the display panel 110A may be configured in the 4-CLK driving method as shown in FIG. 17. The sizes of the transistors ST7 of the pull down parts 240 of two stages at the end portion of the display panel 110A may be configured in the 2-CLK driving method as shown in FIG. 21. The sizes of the transistors ST7 of the pull down parts 240 and the sizes of the transistors ST6 of the pull up part 250 of two stages at the end portion of the display panel 110A may be configured in the 2-CLK driving method as shown in FIG. 22.

According to embodiments, three scan writing pulses may be applied to a single scan line during a frame. Thus, the pixel 111A may represent the desired luminance accurately.

According to embodiments, the sizes of the transistors (e.g. ST7) of four stages at the end portion of the display panel 110A may be configured in the 3-CLK driving method so that image display defects, such as a dark image at the end portion of the display panel 110A, may be prevented.

Embodiments may be applied to a display apparatus and an electronic apparatus including the display apparatus. For example, embodiments may be applied to one or more of a television, a digital television, a three dimensional television, a personal computer, a home appliance, a notebook computer, a table computer, a cellular phone, a smart phone, a personal digital assistant, a portable multimedia player, a digital camera, a music player, a portable game console, a navigation system, etc.

The foregoing is illustrative and is not to be construed as limiting. Although a few embodiments have been described, those skilled in the art will readily appreciate that many modifications are possible in the embodiments without materially departing from the novel teachings and advantages of the embodiments. All such modifications are intended to be included within the scope defined in the claims.

What is claimed is:

1. A scan driver comprising a plurality of stages, the plurality of stages outputting scan writing signals through a plurality of scan lines, the plurality of stages being sequentially disposed,
   wherein each of the stages comprises a signal output part configured to output the scan writing signal to a corresponding scan line,
   wherein a buffer size of the signal output part of an x-th stage of the stages is unequal to a buffer size of the signal output part of a y-th stage of the stages,
   wherein a total number of pixels electrically connected to the x-th stage is equal to a total number of pixels electrically connected to the y-th stage,
   wherein x is a natural number,
   wherein y is another natural number,
   wherein each of the stages is configured to output at least two scan writing pulses to a corresponding scan line during a frame,
   wherein when each of the stages is configured to output at least two scan writing pulses to a corresponding scan line during a frame and an n-th stage is a last stage of the stages,
   a buffer size of a first output transistor of the signal output part of the n-th stage is less than a buffer size of a first output transistor of the signal output part of an (n−2)-th stage, and
   wherein n is a natural number greater than three.

2. The scan driver of claim 1, wherein each of the stages is configured to output at least two scan writing pulses to a corresponding scan line during a frame.

3. The scan driver of claim 2, wherein when each of the stages is configured to output three scan writing pulses to a corresponding scan line during a frame, and
   the buffer size of the first output transistor of the signal output part of the (n−2)-th stage is less than a buffer size of a first output transistor of the signal output part of an (n−4)-th stage,
   wherein n is a natural number.

4. The scan driver of claim 3, wherein when each of the stages is configured to output three scan writing pulses to a corresponding scan line during a frame,
   the buffer size of the first output transistor of the signal output part of the n-th stage is substantially equal to a buffer size of a first output transistor of the signal output part of an (n−1)-th stage, and
   the buffer size of the first output transistor of the signal output part of the (n−2)-th stage is substantially equal to a buffer size of a first output transistor of the signal output part of an (n−3)-th stage.

5. The scan driver of claim 2, wherein when each of the stages is configured to output four scan writing pulses to a corresponding scan line during a frame,
   the buffer size of the first output transistor of the signal output part of the (n−2)-th stage is less than a buffer size of a first output transistor of the signal output part of an (n−4)-th stage, and
   the buffer size of the first output transistor of the signal output part of the (n−4)-th stage is less than a buffer size of a first output transistor of the signal output part of an (n−6)-th stage,
   wherein n is a natural number.

6. The scan driver of claim 5, wherein when each of the stages is configured to output four scan writing pulses to a corresponding scan line during a frame,
   the buffer size of the first output transistor of the signal output part of the n-th stage is substantially equal to as a buffer size of a first output transistor of the signal output part of an (n−1)-th stage, the buffer size of the first output transistor of the signal output part of the (n−2)-th stage is substantially equal to a buffer size of a first output transistor of the signal output part of an (n−3)-th stage, and the buffer size of the first output transistor of the signal output part of the (n−4)-th stage is substantially equal to a buffer size of a first output transistor of the signal output part of an (n−5)-th stage.

7. The scan driver of claim 2, wherein when each of the stages is configured to output two scan writing pulses to the corresponding scan line during the frame.

8. The scan driver of claim 7, wherein the buffer size of the first output transistor of the signal output part of the n-th stage is substantially equal to a buffer size of a first output transistor of the signal output part of an (n−1)-th stage.

9. The scan driver of claim 1, wherein each of the stages further comprises:

a pulse detecting part configured to detect a pulse of an input signal to activate a pull down control node in response to a first clock signal;

a pull down control part configured to initialize the pull down control node in response to a second clock signal; and a pull up control part configured to adjust a signal of a pull up control node in response to the first clock signal and a signal of the pull down control node, and wherein the signal output part is configured to output the scan writing signal in response to the signal of the pull down control node and the signal of the pull up control node, wherein the signal output part comprises:

a pull down part configured to generate a scan writing pulse of the scan writing signal in response to the signal of the pull down control node; and a pull up part configured to maintain a high level of the scan writing signal in response to the signal of the pull up control node.

10. The scan driver of claim 9, wherein a buffer size of a transistor of the pull down part of the x-th stage is unequal to a buffer size of a transistor of the pull down part of the y-th stage.

11. The scan driver of claim 9, wherein a buffer size of a transistor of the pull down part of the x-th stage is unequal to a buffer size of a transistor of the pull down part of the y-th stage, and wherein a buffer size of a transistor of the pull up part of the x-th stage is unequal to a buffer size of a transistor of the pull up part of the y-th stage.

12. The scan driver of claim 9, wherein the pulse detecting part comprises a first transistor, the first transistor comprising a gate electrode to which the first clock signal is applied, a source electrode to which the input signal is applied and a drain electrode connected to a first node, wherein the pull down control part comprises a second transistor and a third transistor, the second transistor comprising a gate electrode connected to the pull up control node, a source electrode to which a first power voltage is applied and a drain electrode connected to a source electrode of the third transistor, the third transistor comprising a gate electrode to which the second clock signal is applied, the source electrode connected to the drain electrode of the second transistor and a drain electrode connected to the first node, wherein the pull up control part comprises a fourth transistor and a fifth transistor, the fourth transistor comprising a gate electrode connected to the first node, a source electrode connected to the gate electrode of the second transistor and a drain electrode connected to a second node, the fifth transistor comprising a gate electrode connected to the second node, a source electrode connected to the gate electrode of the second transistor and a drain electrode to which a second power voltage is applied, wherein the pull down part comprises the first output transistor, the first output transistor comprising a gate electrode connected to the pull down control node, a source electrode connected to an output node and a drain electrode to which the second clock signal is applied, and wherein the pull up part comprises a second output transistor, the second output transistor comprising a gate electrode connected to the gate electrode of the second transistor, a source electrode to which the first power voltage is applied and a drain electrode connected to the output node.

13. The scan driver of claim 1, wherein each of the stages comprises a scan writing stage configured to output the scan writing signal, a scan initialization stage configured to output a scan initialization signal and a scan bypass stage configured to output a scan bypass signal.

14. The scan driver of claim 1, wherein the buffer size of the first output transistor is a width-to-length ratio of the first output transistor.

15. A display apparatus comprising:

a display panel comprising a plurality of scan lines, a plurality of data lines and a plurality of pixels connected to the plurality of scan lines and the plurality of data lines;

a scan driver comprising a plurality of stages, the plurality of stages being connected to the plurality of pixels through the plurality of scan lines, the plurality of stages being sequentially disposed; and a data driver configured to provide data voltages to the plurality of data lines, wherein each of the stages comprises a signal output part configured to output a scan writing signal to a corresponding scan line, wherein a buffer size of the signal output part of an x-th stage of the stages is unequal to a buffer size of the signal output part of a y-th stage of the stages, wherein a total number of pixels electrically connected to the x-th stage is equal to a total number of pixels electrically connected to the y-th stage, wherein x is a natural number, wherein y is another natural number, wherein each of the stages is configured to output at least two scan writing pulses to a corresponding scan line during a frame, wherein when each of the stages is configured to output at least two scan writing pulses to a corresponding scan line during a frame and an n-th stage is a last stage of the stages, a buffer size of a first output transistor of the signal output part of the n-th stage is less than a buffer size of a first output transistor of the signal output part of an (n−2)-th stage, and wherein n is a natural number greater than three.

16. The display apparatus of claim 15, wherein each of the stages further comprises:

a pulse detecting part configured to detect a pulse of an input signal to activate a pull down control node in response to a first clock signal;

a pull down control part configured to initialize the pull down control node in response to a second clock signal; and a pull up control part configured to adjust a signal of a pull up control node in response to the first clock signal and a signal of the pull down control node, and wherein the signal output part is configured to output the scan writing signal in response to the signal of the pull down control node and the signal of the pull up control node.

17. The display apparatus of claim 16, wherein the signal output part comprises:

a pull down part configured to generate a scan writing pulse of the scan writing signal in response to the signal of the pull down control node; and a pull up part configured to maintain a high level of the scan writing signal in response to the signal of the pull up control node.

18. The display apparatus of claim 17, wherein a buffer size of a transistor of the pull down part of the x-th stage is unequal to a buffer size of a transistor of the pull down part of the y-th stage.

19. A scan driver comprising a plurality of stages, the plurality of stages comprising:

a first stage comprising a first output part, the first output part comprising a first output transistor and configured to provide a first signal, the first output transistor having a first buffer value;

a second stage electrically connected to the first output transistor, configured to receive a copy of the first signal, and comprising a second output part, the second output part comprising a second output transistor and configured to provide a second signal, the second output transistor having a second buffer value; and a third stage electrically connected to the second output transistor, configured to receive a copy of the second signal, and comprising a third output part, the third output part comprising a third output transistor and configured to provide a third signal, the third output transistor having a third buffer value, at least one of the second buffer value and the third buffer value being unequal to the first buffer value, wherein a total number of pixels electrically connected to the first stage, a total number of pixels electrically connected to the second stage, and a total number of pixels electrically connected to the third stage are equal to one another, wherein each of the stages is configured to output at least two scan writing pulses to a corresponding scan line during a frame, wherein when each of the stages is configured to output at least two scan writing pulses to a corresponding scan line during a frame and an n-th stage is a last stage of the stages, a buffer size of a first output transistor of the signal output part of the n-th stage is less than a buffer size of a first output transistor of the signal output part of an (n−2)-th stage, and wherein n is a natural number greater than three.

* * * * *